United States Patent
Nakao et al.

(10) Patent No.: US 7,036,060 B2
(45) Date of Patent: Apr. 25, 2006

(54) SEMICONDUCTOR INTEGRATED CIRCUIT AND ITS ANALYZING METHOD

(75) Inventors: Michinobu Nakao, Hitachi (JP); Ryo Yamagata, Sagamihara (JP); Kazumi Hatayama, Hitachinaka (JP); Seiji Kobayashi, Hitachi (JP); Kazunori Hikone, Naka-machi (JP); Kotaro Shimamura, Hitachinaka (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/452,195

(22) Filed: Jun. 3, 2003

(65) Prior Publication Data

US 2003/0200492 A1    Oct. 23, 2003

Related U.S. Application Data

(63) Continuation of application No. 09/401,807, filed on Sep. 22, 1999, now abandoned.

(30) Foreign Application Priority Data

Sep. 22, 1998 (JP) ............................. 10-267689
Mar. 9, 1999 (JP) ............................. 11-61157

(51) Int. Cl.
    *G01R 31/28* (2006.01)

(52) U.S. Cl. ..................... 714/726; 714/738
(58) Field of Classification Search ............... 714/30, 714/42, 25, 45, 710, 711, 718, 724, 726, 733; 712/227

See application file for complete search history.

(56) References Cited

U.S. PATENT DOCUMENTS 5,329,533 A    7/1994    Lin
5,668,947 A    9/1997    Batcher (Continued)

FOREIGN PATENT DOCUMENTS

JP    6-331709    12/1994
JP    9-5403    1/1997
JP    10-197601    7/1998

OTHER PUBLICATIONS

NN9111471 (Enhancing Board Functional Self-Test Concurrent Sampling: IBM Technical Disclosure Bulletin, Nov. 1991, US, vol. No. 34, pp. 471-474.

(Continued)

*Primary Examiner*—Guy J. Lamarre
(74) *Attorney, Agent, or Firm*—Antonelli, Terry, Stout and Kraus, LLP.

(57) ABSTRACT

A semiconductor integrated circuit is provided whose area overhead due to provision of test points is reduced together with the test time period. In a semiconductor integrated circuit having a plurality of observation points in a tested circuit, the plurality of observation points are divided into a preset number of groups. The semiconductor integrated circuit contains at least one compressing circuit to reduce the number of bits of a multi-bit signal and to output the result (a signal of less bits) to an observable element such as an external output element or a flip-flop with a scan function. The semiconductor integrated circuit also has at least two scan chains each of which is made up with a plurality of flip-flop circuits working as shift registers. Further, the two scan chains are interconnected with a single input terminal.

3 Claims, 16 Drawing Sheets

U.S. PATENT DOCUMENTS

| | | |
|---|---|---|
| 5,761,489 A | 6/1998 | Broseghini et al. |
| 5,872,793 A | 2/1999 | Attaway et al. |
| 6,038,691 A | 3/2000 | Nakao et al. |
| 6,202,179 B1 | 3/2001 | Morzano |

OTHER PUBLICATIONS

Youssef et al, "Methodology for Efficiently Inserting and Condensing Test Points", IEEE Proceedings-E, vol. 140, No. 3, May 1993, pp. 154-160.

Motohara et al, "Design for Testability for Complete Test Coverage", IEEE Design & Test of Computers (Nov. 1984), pp. 25-32.

Seiss et al, "Test Point Insertion for Scan-Based BIST", Proceeding of 2nd European Test Conference 1991, pp. 253-263.

Pouya et al., "Modifying User-Defined Logic for Test Access to Embedded Cores", International Test Conference 1997, No. 1-6, 1997, pp. 60-68.

FIG. 10A

| NO. | SCAN FF | TEST POINT TYPE | OUTPUT ELEMENT | INPUT ELEMENT | GROUP ID |
|---|---|---|---|---|---|
| 1 | 855 | CONTROL POINT | 821 | 831 | 1 |
| 2 | 856 | CONTROL POINT | 822 | 831 | 1 |
| 3 | 857 | CONTROL POINT | 823 | 831 | 1 |
| 4 | 858 | CONTROL POINT | 824 | 831 | 1 |
| 5 | 863 | CONTROL POINT | 829 | 834 | 2 |
| 6 | 864 | CONTROL POINT | 829 | 835, 874 | 2 |
| 7 | 873 | OBSERVATION POINT | – | – | 3 |
| 8 | 874 | OBSERVATION POINT | – | – | 4 |

FIG. 10B

| NO. | SCAN FF | TEST POINT TYPE | TEST POINT EFFECT AREA | CONTROL POINT: TEST POINT INFLUENCE AREA, OBSERVATION POINT: TEST POINT SEMI-INFLUENCE AREA | GROUP ID | INDEPENDENT FF |
|---|---|---|---|---|---|---|
| 1 | 902 | CONTROL POINT | 851~854, 831, 834, 841 | 821~824, 801~808, 861, 829, 809~813 | 1 | 809 810 811 |
| 2 | 912 | CONTROL POINT | 861, 862, 834, 841, 835, 842 | 831, 851~854, 821~824, 801~808, 829, 809~811, 830, 812, 813 | 2 | NON |
| 3 | 873 | OBSER/VATION POINT | 831, 851~854, 902, 821~824, 801~808 | 834, 841 | 3 | NON |
| 4 | 874 | OBSER/VATION POINT | 862, 912, 829, 809~811 | 861, 834, 841, 835, 842 | 3 | NON |

FIG. 15

| | 1 | 2 | 3 | 4 | 5 | 6 | 7 | 8 |
|---|---|---|---|---|---|---|---|---|
| CK | | | ⊓ | | | ⊓ | | |
| MC | ⊓ | ⊓ | | ⊓ | ⊓ | | ⊓ | |
| SC | ⊓ | ⊓ | ⊓ | ⊓ | ⊓ | ⊓ | ⊓ | |
| 1151 | a12 | a11 | X | a22 | a21 | X | X | X |
| 1152 | b12 | b21 | X | b22 | b21 | X | X | X |
| 1411 | X | a12 | a11 | p11 | a22 | a21 | p21 | X |
| 1412 | X | X | a12 | p12 | p11 | a22 | p22 | P21 |
| 1421 | X | b12 | b11 | q11 | b22 | b21 | q21 | X |
| 1422 | X | X | b12 | q12 | q11 | b22 | q22 | q21 |
| 1431 | X | a12 | a11 | r11 | a22 | a21 | r21 | X |
| 1432 | X | X | a12 | r12 | r11 | a22 | r22 | r21 |
| 1441 | X | b12 | b11 | s11 | b22 | b21 | s21 | X |
| 1442 | X | X | b12 | s12 | s11 | b22 | s22 | s21 |
| 1161 | X | X | X | p12+r12 | p11+r11 | X | p22+r22 | p21+r21 |
| 1162 | X | X | X | q12+s12 | q11+s11 | X | q22+s22 | q21+s21 |

SEMICONDUCTOR INTEGRATED CIRCUIT AND ITS ANALYZING METHOD

This application is a continuation of U.S. application Ser. No. 09/401,807, filed Sep. 22, 1999, now abandoned, the entire disclosure of which is incorporated herein by reference.

FIELD OF THE INVENTION

The present invention relates to a semiconductor integrated circuit whose area overhead has been reduced by test points and an analyzing method therefor. Further, the present invention relates to a semiconductor integrated circuit and a memory medium which have test circuits designed by a shift scanning method.

BACKGROUND OF THE INVENTION

A method of inserting test points into semiconductor integrated circuits has been used as one means for testing semiconductor integrated circuits. Generally, there are three kinds of test points: a "1" control point which increases the controllability of signal lines to "1" (hereinafter called "1" controllability), a "O" control point which increases the controllability of signal lines to "O" (hereinafter called "O" controllability), and an observation point which increases the observability of a signal value of a signal line. The "1" and "O" control points are simply called control points when they need not be distinguished from each other.

Methods of analyzing circuits and locations of such test points are disclosed in "Test Points Insertion for Scan-Based BIST (Built-In Self Test)" by B. Seiss and others (P.253 through 262), "Proceeding of 2nd European Test Conference (1991) and "Circuit having improved testability and Methods of improving testability of circuits," Japanese Non-examined Patent Publication No.06-331709 (1994).

Particularly, the test point analyzing method in the former document determines each test point to minimize a cost function which is defined by a probability-based testability scale called COP (Controllability observability Procedure). In other words, a procedure to determine one test point comprises selecting approximate test point locations according to estimated values of the cost function for insertion of test points, calculating an actual value of the cost function for insertion of the test point on each possible location, selecting a location which minimizes the cost function, and placing the test point there. This procedure is repeated until all test point locations are determined. From experiments, it is recognized that this test point analyzing method is effective for testability of random-number patterns.

Further, some methods have been provided to reduce the area overhead due to provision of test points. One of such methods is disclosed in "Testability designing for attaining a complete detection ratio," Design Automation Research Document 19 (1983), Information Processing Society of Japan. In this document, the number of controllable elements can be reduced by controlling a plurality of control points having a single common output element by branching from one controllable element. Another method is disclosed in "Modifying user Defined Logic for Test Access to Embedded Cores" by B. Pouya and others (P.60 through 68), "Proceeding of International Test Conference" (1997). It proposes sharing test data input lines of control points.

This method performs an implication operation from a control point location toward the input and shares pairs of signal lines which input test data to control points causing no redundant fault even when they are shared.

Another technology for testability of semiconductor integrated circuits is a scanning method wherein a circuit is added which enables the setting of values for all flip-flops (hereinafter abbreviated as FFs) and provides for reading values from them. This scanning method can treat a sequence circuit having an internal status which makes generation of a test pattern difficult as a combination circuit having no internal status. The scanning method can be loosely divided into two methods: a shift-scanning method which uses shift registers to set values in chain-connected FFs and which reads values from the FFs, and an address scanning method which uses addresses assigned to FFs to select a FF to set a value or to read a value from it. In general, the shift scanning method uses a simpler circuit than the address scanning method. However, the address scanning method can select FFs more easily to set values or to read values from them.

However, the shift scanning method accesses all FFs that are chain-connected (hereinafter called a scan chain) even when part of the scan chain is value-set or read because the FFs work as shift registers. Therefore, the problems of the shift scanning method are to provide the ability to handle a great quantity of data required for testing (quantity of test data) and to take much time to effect the test. A technique for solving these problems is disclosed in "Semiconductor Integrated Circuit," Japanese Non-examined Patent Publication No.09-5403 (1997). This technique comprises dividing flip-flops (FFs) in the scan chain into a plurality of groups and placing a by-path selector on each dividing point to selectively bypass respective FF groups and disabling the FFs belonging to the bypassed groups.

This technique reduces the number of steps to set values to flip-flops and consequently reduces the quantity of test data and the time required for testing.

SUMMARY OF THE INVENTION

To insert test points in the aforesaid tested circuit, each test point requires one test-dedicated flip-flop having a scanning function. These flip-flops occupy more areas in the circuit. This factor hereinafter will be called an area overhead. If the tested circuit has too many test points, its area overhead may be unallowable.

Although the conventional methods of inserting testing points (disclosed in the documents and by B. Pouya and others) can reduce the area overhead due to insertion of control points, these methods less effectively reduce the entire area overhead due to insertion of control points and observation points.

Judging from the aforesaid problems, a first object of the present invention is to provide a semiconductor integrated circuit which is capable of reducing the area overhead due to insertion of test points and a method of analyzing the circuit.

Further, although the method disclosed in "Semiconductor Integrated Circuit," Japanese Non-examined Patent Publication No.09-5403 (1997) can solve the problems of the shift scanning method, such as too much test data to be handled and too much test time, it still has a problem of too much circuit-area overhead due to provision of bypassing signal lines and control circuits.

Another object of the present invention is to provide a semiconductor integrated circuit reducing for the quantity of test data, the test time, and the circuit-area overhead, which are still problems in the shift scanning method.

A semiconductor device to attain the first object of the present invention has compressing circuits. To the input of each compressing circuit there are connected signal lines which are respectively branched out from signal lines in a tested circuit corresponding to an observation point group. The output of each compressing circuit is connected to an external output element or an observable element, such as a flip-flop having a scanning function. With this, the compressing circuit can convert a multi-bit signal into a signal having less bits.

A semiconductor integrated circuit to attain the first object of the present invention is equipped with a compressing circuit which is placed between observation points and observable elements to connect signal lines branched from signal lines in a tested circuit having observation points finally to an external output element or an observable element such as a flip-flop having a scanning function in the tested circuit and a circuit to mask logical values of signals lines which are used at the observation points in normal operation. The compressing circuit receives inputs from said signals lines and signal lines in the tested circuit.

A semiconductor device to attain the first object of the present invention for a semiconductor integrated circuit having control points in the tested circuit is equipped with a circuit to mask logical values of signal lines which input test data from the control points in normal operation to connect said test-data input signal lines finally to an external input element or controllable element such as a flip-flop having a scanning function in the tested circuit.

Furthermore, said first object is attained by connecting signal lines which input test data from control points inserted into logically equivalent or non-equivalent signal lines to an identical external input element or controllable element such as a flip-flop having a scanning function in the tested circuit.

To attain said second object, the semiconductor integrated circuit designed in a shift scanning method according to the present invention is equipped with a plurality of flip-flop circuits which work as shift registers and at least two partial circuits consisting of a scan chain which connects said flip-flop circuits. At least two of said partial circuits are interconnected with a single input terminal.

This sharing of an input terminal by two or more partial circuits can reduce the number of terminals and the quantity of test data to be entered. Consequently, the present invention can provide a semiconductor integrated circuit whose circuit-area overhead is suppressed.

BRIEF DESCRIPTION OF THE DRAWINGS

FIGS. 10A and 10B are tables of information used to design a semiconductor integrated circuit according to the present invention.

FIG. 15 is a table which shows waveforms of signals of a semiconductor integrated circuit according to the sixth embodiment of the present invention.

DESCRIPTION OF THE PREFERRED EMBODIMENT

The embodiments of the present invention will be explained below with reference to the accompanying drawings.

Figure 1:
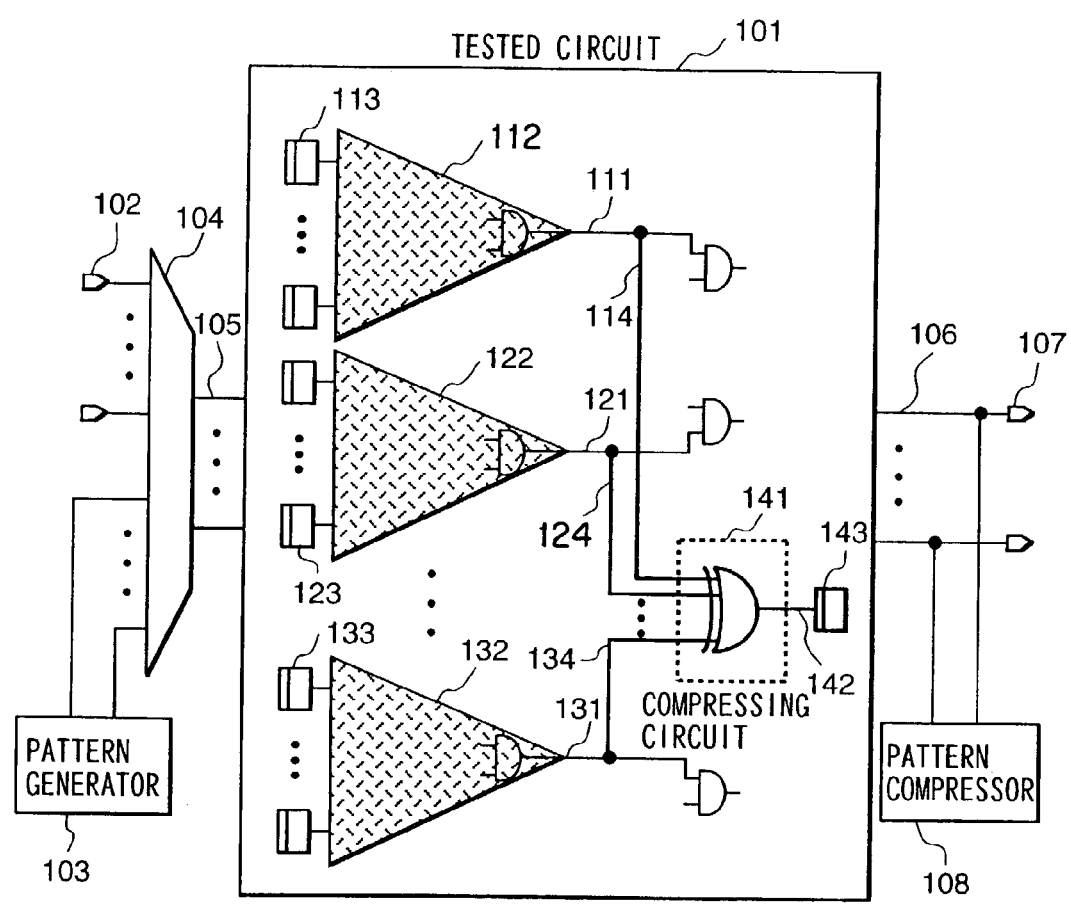
FIG. 1 is a schematic circuit diagram showing an example of a semiconductor integrated circuit having its area overhead due to control points reduced, representing a first embodiment of the present invention.

Referring to FIG. 1, which shows an example of a semiconductor integrated circuit having its area overhead due to control points reduced, according to a first embodiment of the present invention, the semiconductor integrated circuit consists of a tested circuit 101, external input terminals or scan chain input terminals 102, a pattern generator 103, a multiplexer 104, input signal lines 105 (input to the tested circuit 101), output signal lines 106 (output from the tested circuit 101), external output terminals or scan chain output terminals 107, and a pattern compressor 108. The multiplexer 104 selects either a pattern (signals) from the external input terminals or scan chain input terminals 102 or a pattern (signals) from the pattern generator 103 and outputs it to the signal lines 105.

The operation of said tested circuit 101 will be explained below.

In the built-in self test (BIST), a pattern from the pattern generator 103 is selected by the multiplexer 104 and sent to the tested circuit 101 through signal lines 105 to test the circuit 101. The pattern output from the tested circuit 101 is sent to the pattern compressor 108 through signal lines 107 where the signals are compressed there. In the case where a tester directly transfers a test pattern to and from the tested circuit 101, the pattern from the tester through the external input terminals or scan chain input terminals 102 is selected and fed to the tested circuit 101 through signal lines 105 to test the circuit 101. The pattern output from the tested circuit 101 is returned to the tester through signal lines 106 or external output terminals or scan chain input terminals 107, where they are observed by the tester.

Figure 8A:
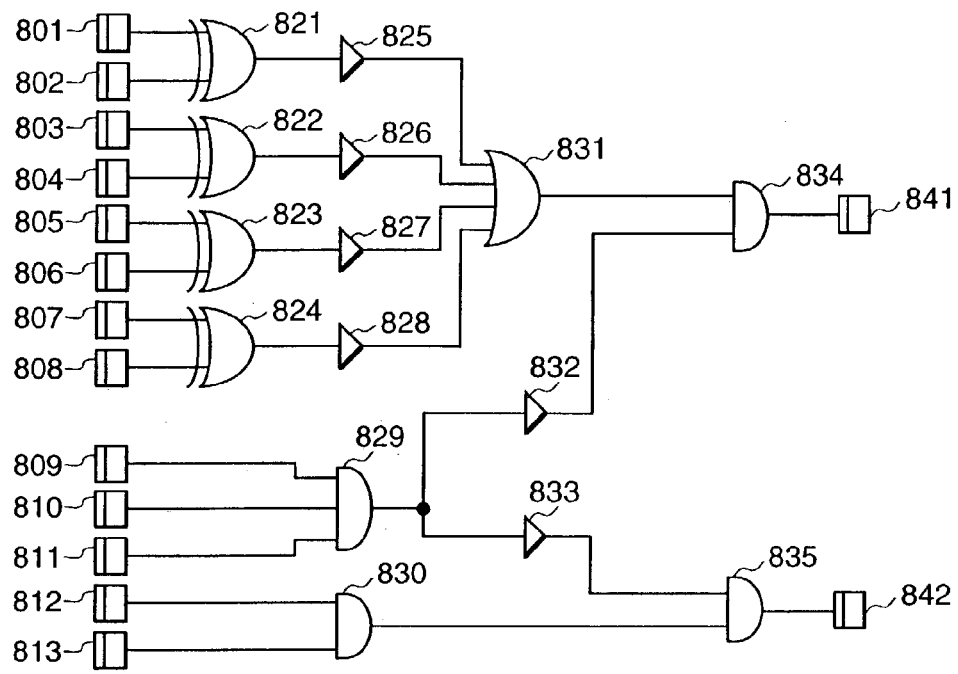
FIGS. 8A and 8B are circuit diagrams of a semiconductor integrated circuit having test points inserted.
Figure 8B:
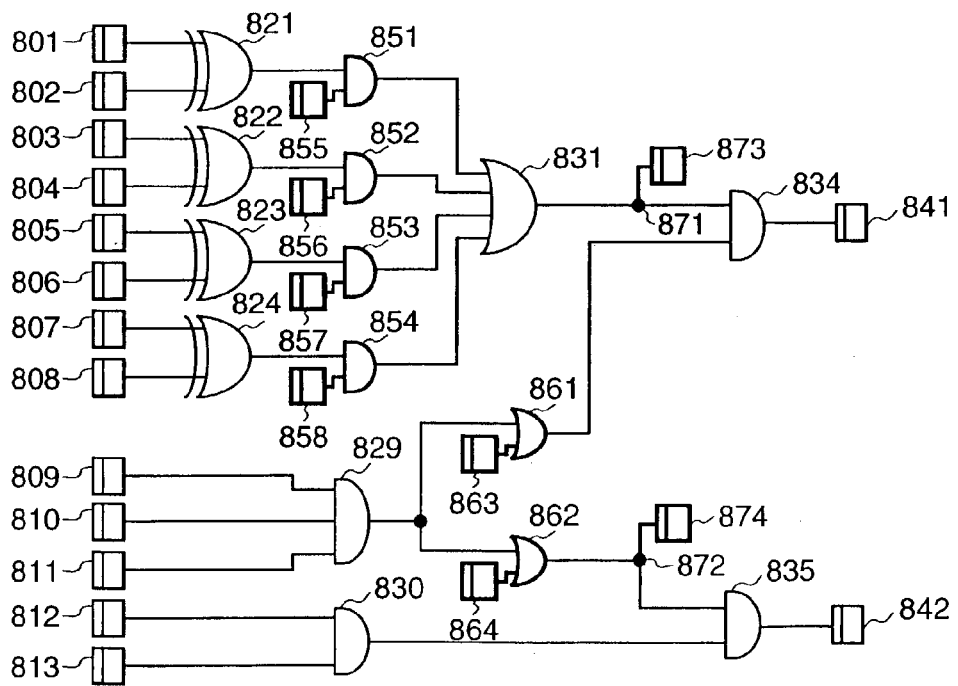

Before explaining the tested circuit 101, test points will be explained briefly with reference to FIGS. 8A and 8B. FIG. 8A is a diagram of a logical circuit without a test point. This logical circuit consists of scan-in flip-flops 801 through 813 having a scan function, scan-out flip-flops 841 through 842, EOR elements 821 through 824, BUF elements 825 through 828 and 832 through 833, AND elements 829 through 830 and 834 through 835, OR element 831, and signal lines connecting these elements. FIG. 8B is a diagram logical circuit in which test points are inserted.

For example, a "O" control point can be inserted by replacing the BUF element 825 by a set of an AND element 851 and a scan flip-flop 855. This enables setting the AND element 851 to "O" when the scan flip-flop 855 is set to "O" during testing, which increases the "O" controllability of the output line of the AND element 851. In normal operation, the scan flip-flop 855 has a fixed signal value of "1." Similarly, "O" control points can be inserted by replacing the BUF elements 826 through 828, respectively, by a set of an AND element (852 through 854) and a scan flip-flop (856 through 858).

Further, a "1", control point can be inserted by replacing the BUF element 832 by a set of an OR element 861 and a scan flip-flop 863. This enables setting the OR element 861 to "1" when the scan flip-flop 863 is set to "1" during testing, which increases the "1", controllability of the output line of the OR element 861. In normal operation, the scan flip-flop 863 has a fixed signal value of "1." Similarly, "1" control points can be inserted by replacing the BUF element 833 by a set of an OR element 862 and a scan flip-flop 864.

Now returning to the explanation of the tested circuit 101, the tested circuit 101 has observation points on signal lines 111, 121, and 131. The signal lines 114, 124, and 134 from the observation points are all connected to the compressing circuit 141 and the output of the compressing circuit 141 is connected to the scan flip-flop 143 through the signal line 142. Areas 112, 122, and 132 are for traced input signal lines between signal lines 111, 121, and 131 and scan flip-flop groups 113, 123, and 133 and therefore they are areas for signals lines 111, 121, and 131. We define an observation point effect area as a signal line area whose observability can be increased by insertion of observation points.

Figure 2A:
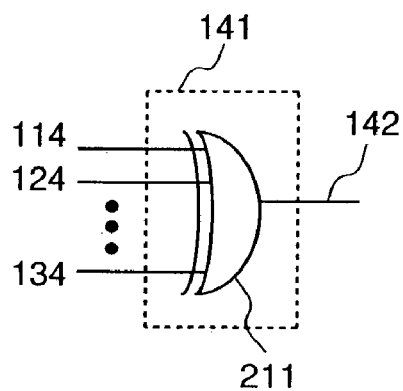
FIGS. 2A–2D are diagrams showing respective embodiments of a compressing circuit.
Figure 2B:
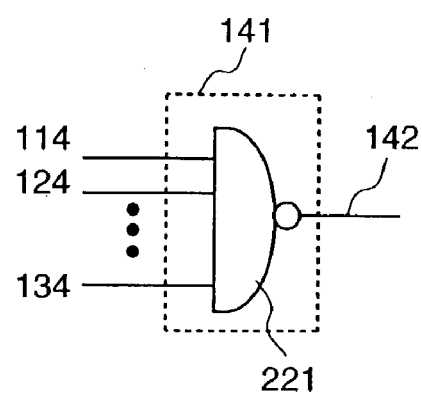

An explanation will be given as to how a test is carried out in the tested circuit 101. This example assumes that the compressing circuit 141 is an exclusive OR element having multiple inputs and one output, as seen in FIG. 2A. First, logical value patterns are respectively set for scan flip-flop groups 113, 123, and 133. The signal values are respectively sent in sequence towards the outputs and finally get to signal lines 111, 121, and 131. The signal values equal to those on the signal lines having observation points are fed to the compressing circuit 141 through signal lines 114, 124, and 134, are exclusively ORed there, and are output to the scan flip-flop 143. The signal value is observed there. If the area 112 contains any fault, a signal value different from a signal value in the normal operation (which is called a fault signal value) is sent to the scan flip-flop 143 assuming that the fault signal will not propagate into the other signal lines 121 and 131. If a fault signal enters one of the inputs, it is always observed because the input and the output of the Exclusive OR element have the same observability.

In this embodiment, a conventional group of scan flip-flops, each of which must be provided for each observation point, is replaced by a set of a single scan flip-flop 143, a compressing circuit 141, and wire extensions (signal lines 114, 124, and 134). The testability of this embodiment is just the same as that of the aforesaid conventional group of scan flip-flops, assuming a single stuck-at fault model.

Although this embodiment uses scan flip-flops of observation point groups whose observation point effect areas do not overlap with each other, scan flip-flops of observation points can be freely used regardless of the conditions. However, in this case, it may happen that a fault occurs in an area where the observation point effect areas overlap with each other, that the fault signal propagates into the two observation points, and, as a result, that the fault signal may be eliminated by the compressing circuit. When scan flip-flops are used freely without a limitation of observation point effect areas, the testability may be less effective. It is apparent that the rate of reduction in the area overhead is greater than that of a case considering the limitation of the observation point effect areas.

As explained above, using (sharing) scan flip-flops of observation points whose observation point effect areas do not overlap with each other can reduce the area overhead due to insertion of observation points without decreasing the testability. Further, sharing scan flip-flops of any observation points can greatly reduce the area overhead due to insertion of observation points.

FIGS. 2A–2D show examples of compressing circuits 141.

The compressing circuit 141 of FIG. 2A can retain high observability after compression as explained above.

To monitor a fault signal input by the output of the compressing circuit 141 of FIG. 2A, which is a NAND element of multiple-input and one output, the other input must be non-control logic (logical "1" of NAND element). Therefore, if the input lines 114 through 134 of the compressing circuit 141 have great controllability, the observability of the input lines will hardly go down. The compressing circuit formed by a NAND element is used when the above conditions are satisfied. As a NAND element will be generally made up of less transistors than an Exclusive OR element, the compressing circuit 141 of FIG. 2B can reduce the area overhead more than the compressing circuit 141 of FIG. 2A.

In the compressing circuit 141 of FIG. 2A, the input lines 114 and 124 have great "1" controllability and the input line 134 has great "O" controllability. All input lines of the compressing circuit 141 can have "1" controllability when a NOT element 232 is inserted into the input line 134. with this, the observability of input lines of the compressing circuit can be retained.

Figure 2C:
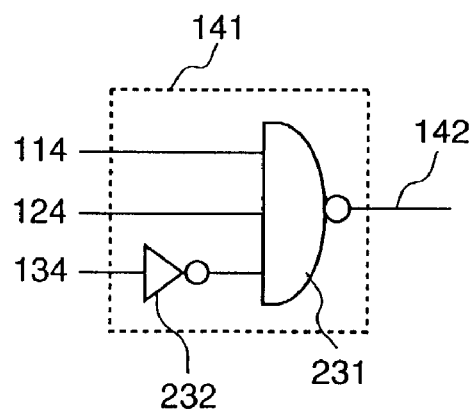
Figure 2D:
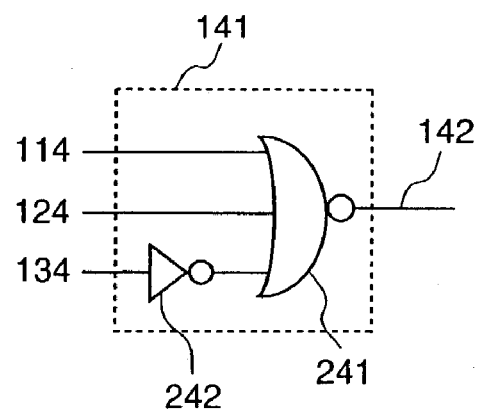

The compressing circuit of FIG. 2D is approximately the same as the compressing circuit 141 of FIG. 2C. The input lines 114 and 124 have great "O" controllability and the input line 134 has great "1" controllability. All input lines of the compressing circuit 141 (NOA element) can have "O" controllability when a NOT element 242 is inserted into the input line 134. With this, the observability of input lines of the NOA element can be retained.

As explained above, the area overhead due to insertion of observation points of a semiconductor integrated circuit can be reduced without decreasing the testability by using an AND element, NAND element, OR element, or NOR element of multiple input and one output type as a compressing circuit shared by scan flip-flops of observation points and connecting a negation element just before an input line of the compressing circuit according to the controllability of the input line so that the controllability of a non-control logical value may be great.

The built-in self test (BIST) to analyze a semiconductor integrated circuit for controllability and observability generally uses a probability-based testability scale called COP (Controllability Observability Procedure). This procedure calculates a controllability ("1" controllability) from input to output according to the Law of Probability, and then calculates controllability from output to input. In contrast, a test method inputting test patterns from a tester uses the Goldstain scale (see "Controllability/observability Analysis of Digital Circuits" written by L. H. Goldstain, IEEE Trans. On Circuits and Systems (1979)).

Figure 3:
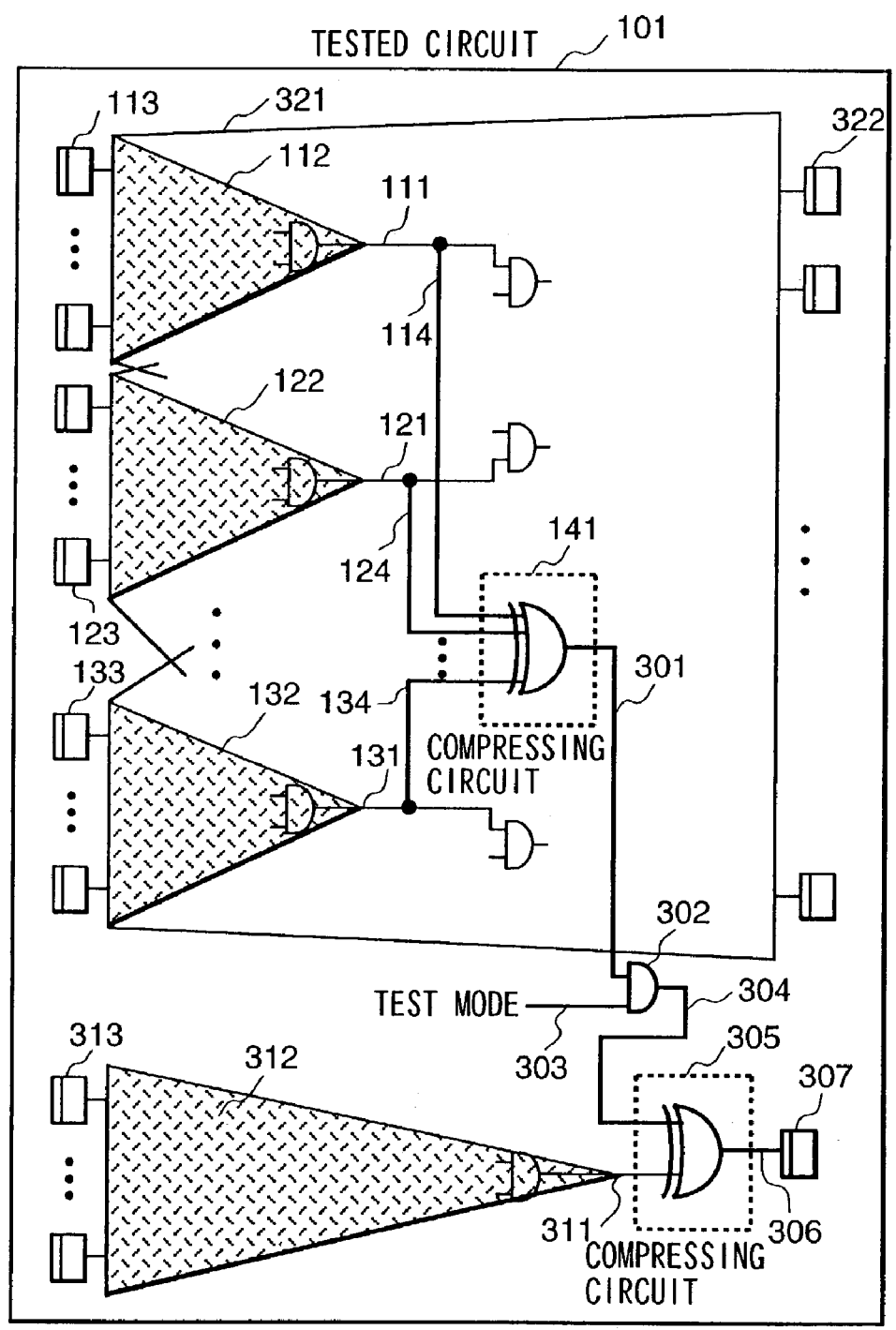
FIG. 3 is a schematic circuit diagram showing an example of a semiconductor integrated circuit having its area overhead due to control points reduced, representing a second embodiment of the present invention.

FIG. 3 is a diagram showing an example of a semiconductor integrated circuit having its area overhead due to control points reduced, according to a second embodiment of the present invention. Its peripheral units are the same as those in FIG. 1.

The tested circuit 101 has observation points on signal lines 111, 121, and 131. The signal lines 114, 124, and 134 from the observation points are all connected to the compressing circuit 141. The output of the compressing circuit 141 is connected to an AND element 302 through a signal line 301 and is ANDed by the Test Mode signal line 303. The output line 304 of the AND element 302 is fed into the compressing circuit 305 together with a signal line 311 from a tested circuit. The output of the compressing circuit is connected to the scan flip-flop 307 through the output line 306. Areas 112, 122, 132 and 312 are areas of signal lines traced from signal lines 111, 121, 131 and 311 to scan flip-flop groups 113, 123, 133 and 313 towards the input; and, therefore, they are the observation point effect areas of observation points placed on signal lines 111, 121, and 131 and the observation point effect area of the scan flip-flop 307 used for normal logic. The area 321 is an area of signal lines traced from the observation point effect areas 112, 122, and 132 to the scan flip-flop 322 towards the output and this area is called an observation point semi-effect area. The Test mode signal line 303 is logical "1", during a test operation or "0" in the normal operation and masks a signal value on the signal line (having the output of the compressing circuit) by the AND element 302 so that the signal value of the signal line 311 may be correctly transferred to the signal line 306 in the normal operation.

Although those areas whose observability changes consist only of the observation point effect areas, a prefix "semi-" of the observation point semi-influence area is given because the area is used to determine observable elements in the tested circuit in which observation points and the observation point effect areas do not overlap with each other. As for observable elements in the tested circuit which do not belong to the union of observation point semi-effect areas of each observation point in a certain observation point group, respective observation points and the observation point influence areas do not intersect with each other.

An explanation will be given as to how the test is carried out in the tested circuit 101. This example assumes that the compressing circuits 141 and 305 are exclusive OR elements each of which has multiple inputs and one output as seen in FIG. 2A. First, logical value patterns are respectively set for scan flip-flop groups 113, 123, and 133. The signal values are respectively sent in sequence towards the outputs and finally get to signal lines 111, 121, and 131. The signal values equal to those on the signal lines having observation points are fed to the compressing circuit 141 through signal lines 114, 124, and 134, and exclusively ORed there, and are output to the signal line 301.

As the Test mode signal line 303 is logical "1", the signal value on the signal line 301 is directly placed on the signal line 304. On the other hand, a pattern set on the scan flip-flop group 313 propagates as signal values in sequence towards the output until it reaches the signal line 311. The compressing circuit 305 compresses two signals on the signal lines 304 and 311 into one bit and outputs the result to the scan flip-flop 307, which is used with a normal logic. The signal value is observed there. If the area 112 contains any fault and the fault signal propagates to the signal line 111, but the fault signal does not propagate to the other signal lines 121, 131, and 311, the fault signal propagates to the scan flip-flop 307. If the area 312 contains any fault and the fault signal propagates to the signal line 311, but the fault signal does not propagate to the other signal lines 111, 121, and 131, the fault signal propagates to the scan flip-flop 307.

An explanation will be given as to how the normal operation is carried out in the tested circuit 101. First, logical value patterns set for scan flip-flop groups 113, 123, and 133 are respectively sent in sequence towards the outputs and finally get to signal lines 111, 121, and 131. The signal values equal to those on the signal lines having observation points are fed to the compressing circuit 141 through signal lines 114, 124, and 134, are exclusively ORed there, and are output to the signal line 301. However, as the Test Mode signal line 303 is logical "0," the signal line 304 has a value of "O" independently of the signal value of the signal line 301. Accordingly, the compressing circuit 305 sends the signal value of the signal line 311 directly to the signal line 306. The signal value is observed on the scan flip-flop 307. In this embodiment, a conventional group of scan flip-flops, each of which must be provided for each observation point, is replaced by a set of the compressing circuits 141 and 305, the AND element 302, the Test Mode signal line 303, and the wire extensions (signal lines 114, 124, and 134) only. No scan flip-flop for observation points is required. The testability of this embodiment is just the same as that of the aforesaid conventional group of scan flip-flops, assuming a single stuck-at fault model. However, this procedure has a problem in that the signal delay becomes greater as the compressing circuit is inserted into a normal logical path (between the signal lines 311 and 306).

Although this embodiment uses observation points and scan flip-flops of normal logic which do not intersect with the observation point effect areas, observation point normal logic scan flip-flops can be freely used regardless of the conditions.

However, in this case, it may happen that a fault occurs in an area where the observation point effect areas overlap with each other, that the fault signal propagates into the two observation points, and, as a result, that the fault signal may be eliminated by the compressing circuit. Namely, when scan flip-flops are used freely without a limitation of observation point effect areas, the testability may be less effective.

It is apparent that the rate of reduction in the area overhead is greater than that of a case considering the limitation of the observation point effect areas.

As explained above, using (sharing) scan flip-flops of observation points whose observation point effect areas do not overlap with each other can reduce the area overhead due to insertion of observation points without decreasing the testability.

Figure 4:
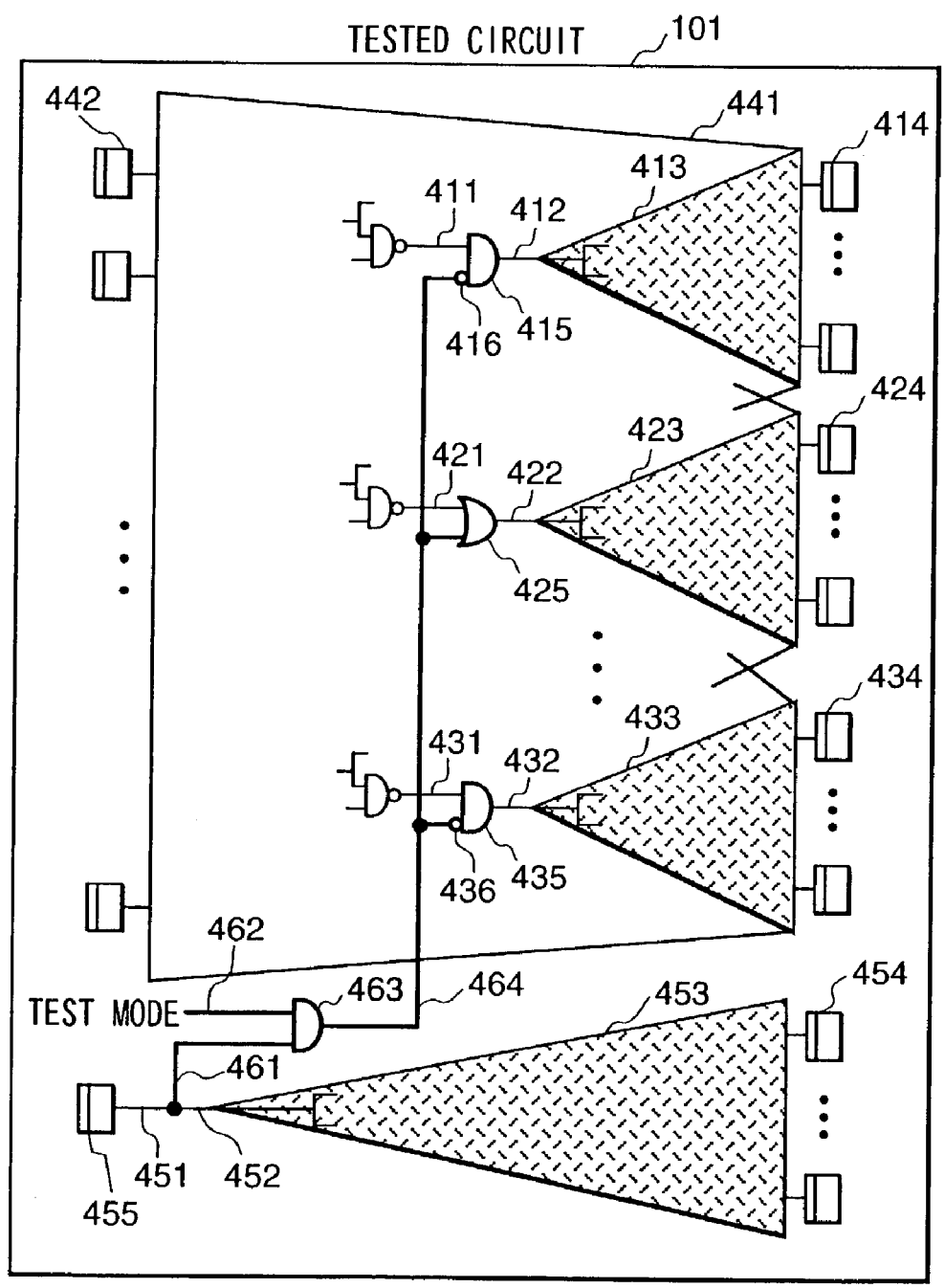
FIG. 4 is a schematic circuit diagram showing an example of a semiconductor integrated circuit having its area overhead due to control points reduced, representing a third embodiment of the present invention.

FIG. 4 is a diagram showing an example of a semiconductor integrated circuit having its area overhead due to control points reduced, according to a third embodiment of the present invention.

In the tested circuit 101, signal lines 411, 421, and 431 respectively have "O" control point 415, "1" control point 425, and "O" control point 435 in that order to increase the "O" controllability of the signal line 412, "1", controllability of the signal line 422, and "O" controllability of the signal line 432, respectively. The test data signal is supplied to these control points from a single signal line 464. The signal line 464 is the output of an AND element 463 which inputs a signal line 461 branched from the signal line 451 output from the normal logic scan flip-flop 455 and a Test Mode signal line 462. The Test Mode line 462 is logical "1", during testing or "0" in the normal operation. Negation logics 416 and 436 are inserted so that the test data signal may have a non-control logic value for the element used at the control point in order to eliminate the function of each control point in the normal operation.

Areas 413, 423, 433 and 453 are areas of signal lines traced from signal lines 412, 422, 432 and 452 to scan flip-flop groups 414, 424, 434 and 454 towards the output and therefore they are the observation point effect area of observation points placed on signal lines 411, 421, and 431 and the observation point effect area of the scan flip-flop 455 used for normal logic. The area 441 is an area of signal lines traced from the observation point effect areas 413, 423, and 433 to the scan flip-flop 442 towards the input and this area is called a control point influence area. The Test mode signal line 462 is logical "1", during a test operation or "0" in the normal operation and masks a signal value on the signal line 461 (having the output of the compressing circuit) by the AND element 463 so that the signal values of the signal lines 411, 421, and 431 may be correctly transferred to the signal lines 412, 422, and 432 in the normal operation.

The control point influence area 441 is an area whose controllability or observability changes and this area contains a control point effect area. This area is used to determine a controllable element in a tested circuit whose control points and control-point effect areas do not overlap. As for a controllable element in a tested circuit which do not belong to the union of observation point influence areas of each observation point in a certain observation point group, respective observation points and the observation point effect areas do not intersect with each other.

An explanation will be given as to how a test is carried out in the tested circuit 1—1. First, a logical value pattern is set on a scan flip-flop group 442. The signal values are respectively sent in sequence towards the outputs and finally get to signal lines 411, 421, and 431. one part of the signal value set on a normal-logic scan flip-flop 455 is sent to the scan flip-flop group 454 through signal lines 451 and 452 and the area 453. As the signal value of the Test Mode signal line 462 is "1," the other part of the signal value is sent to the signal line 464 through the signal line 461 and is fed as test data to control points 415, 425, and 435. Then, it is sent out to the scan flip-flop groups 414, 424, and 434, respectively, through signal lines 412, 422, 432 and areas 413, 423, and 433.

An explanation will be given as to how a normal operation is carried out in the tested circuit 101. First, a logical value pattern is set on a scan flip-flop group 442. The signal values are respectively sent in sequence towards the outputs and finally get to signal lines 411, 421, and 431. One part of the signal value set on a normal-logic scan flip-flop 455 is sent to the scan flip-flop group 454 through signal lines 451 and 452 and the area 453. As the signal value of the Test Mode signal line 462 is "0," the signal value of the scan flip-flop 455 is masked by the AND element 463, and, as a result, the signal line 464 is always "0."

As logical "1," "O," and "1" values which are non-control logical values of the control points 415, 425, and 435 are fed as test data to the control points, the signal values of the signal lines 411, 421, and 431 are directly transferred to the signal lines 412, 422, and 432.

In this embodiment, a conventional group of scan flip-flops, each of which must be provided for each control point, is replaced by a set of the Test Mode signal line 462, an AND element 463, and a wire extension (signal line 464).

No scan flip-flop for control points is required. The testability of this embodiment is just the same as that of the aforesaid conventional group of scan flip-flops.

Although this embodiment uses control points and normal-logic scan flip-flops which do not intersect with the observation point effect areas, control points and normal logic scan flip-flops can be used freely regardless of the conditions. However, in this case, when a fault occurs closer to the input in an area which overlaps with a control point effect area, the fault signal may be lost by a re-convergent structure formed by the scan flip-flops which are shared. Namely, when scan flip-flops are used freely without a limitation of observation point effect areas, the testability may be less effective.

It is apparent that the rate of reduction in the area overhead is greater than that of a case considering the limitation of the observation point effect areas.

As explained above, using (sharing) control points and normal-logic scan flip-flops, whose observation point effect areas do not overlap with each other, can reduce the area overhead due to insertion of control points without decreasing the testability.

FIGS. 5A–5D show examples of circuits capable of reducing the area overhead due to provision of control points, according to the fourth embodiment of the present invention.

Figure 5A:
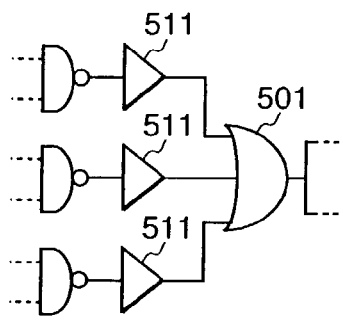
FIGS. 5A–5D are circuit diagrams showing examples of circuits for reducing the area overhead due to control points, which are used in a fourth embodiment of the present invention.
Figure 5B:
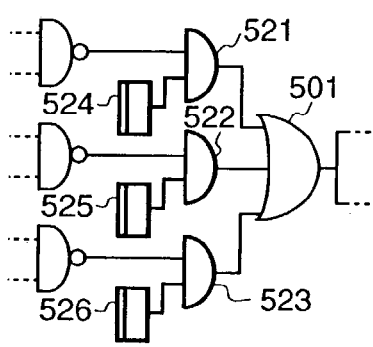
Figure 5C:
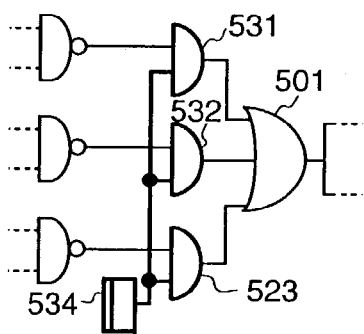
Figure 5D:
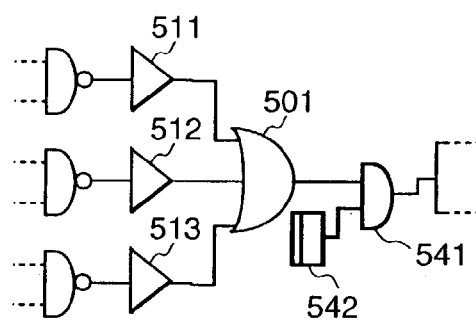

FIG. 5A shows a circuit without a test point. To insert a control point, there is a way of allowing replacement of a certain cell by a control point to suppress the overhead of signal delays. This example assumes that the BUF elements 511, 512, and 513 are replaced only by AND or OR elements. To increase the "O" controllability of the output of the OR element 501, the BUF elements are respectively replaced by sets of an AND element (521, 522, or 523) and a scan flip-flop (524, 525, or 526) which work as control points, as shown in FIG. 5B. However, as shown in FIG. 5C, when the control points share a single scan flip-flop 534, the number of scan flip-flops for control points can be reduced down to one. As for the testability of this circuit, when you want to set the output line of the OR element to "0," you must set all signal values of the scan flip-flops 524, 525, and 526 to "O" in FIG. 5B, but you have only to set the signal value of the scan flip-flop 534 to "O" in FIG. 5C. Therefore, you can say that the circuit in FIG. 5C has a higher "O" controllability of the output line of the OR element than the circuit of FIG. 5B. The circuit of FIG. 5C is substantially equivalent to the circuit of FIG. 5D having a "O" control point on the output line of the OR element. Therefore, the circuit sharing a scan flip-flop dedicated for control points is analyzed as the circuit of FIG. 5D.

As explained above, using (sharing) scan flip-flops of control points for signal lines connected to an identical element can reduce the area overhead due to insertion of control points without decreasing the testability.

FIGS. 6A–6D are circuit diagrams showing examples of a semiconductor integrated circuit having its area overhead due to control points reduced, according to the fifth embodiment of the present invention.

Figure 6A:
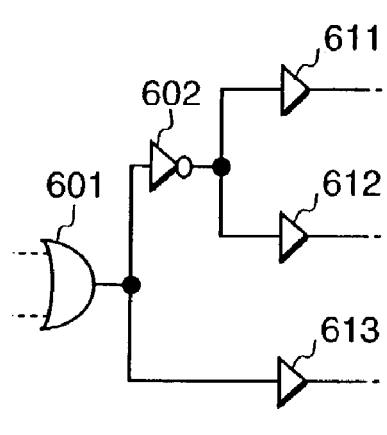
FIGS. 6A–6D are circuit diagrams showing examples of circuits for reducing the area overhead due to control points, which are used in a fifth embodiment of the present invention.
Figure 6B:
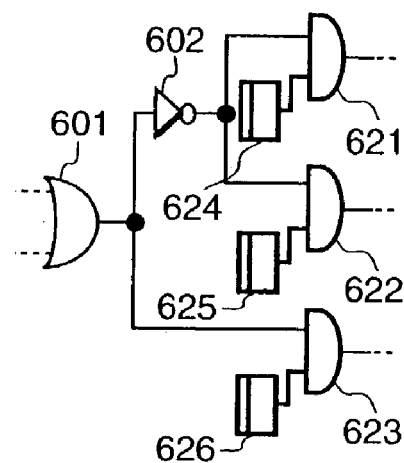

FIG. 6A shows a circuit without a test point. To suppress signal delays due to insertion of control points, this example assumes that the BUF elements 611, 612, and 613 are replaced only by AND or OR elements for insertion of control points. To increase the "1", controllability of the BUF elements 611 and 612 and the "O" controllability of the BUF element 613, the BUF elements are respectively replaced by sets of an AND element (621, 622, or 623) and a scan flip-flop (624, 625, or 626) which work as control points as shown in FIG. 6B.

Figure 6C:
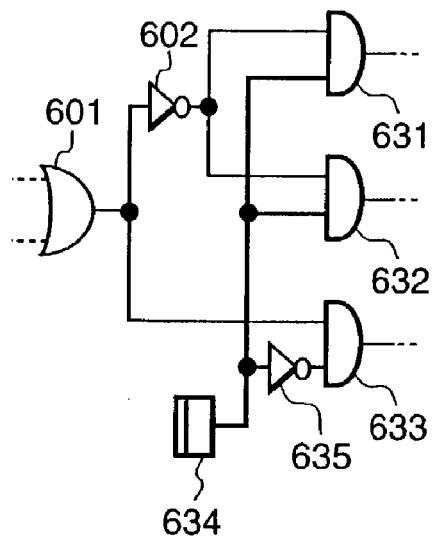

However, as shown in FIG. 6C, when the control points share a single scan flip-flop 634, the number of scan flip-flops for control points can be reduced down to one. As for the testability of this circuit, when you want to set the output lines of the BUF elements 611 and 612 to "1" and the output line of the BUF element 613 to "O," you must set signal values of the scan flip-flops 624, 625, and 626 respectively to "1," "1," and "O" in FIG. 6B, but you have only to set the signal value of the scan flip-flop 634 to "O" in FIG. 6C.

Figure 6D:
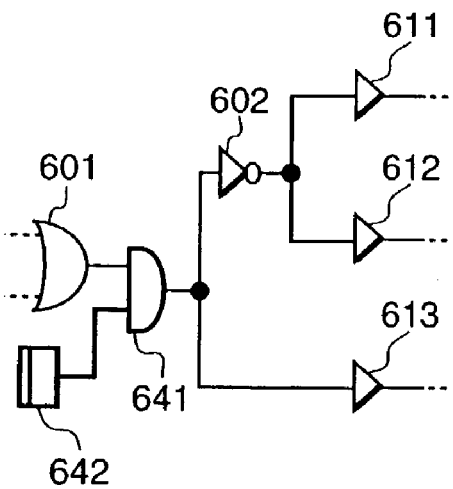

The circuit of FIG. 6C is substantially equivalent to the circuit of FIG. 6D having a "O" control point on the output line of the OR element 601. Therefore, the circuit sharing a scan flip-flop dedicated for control points is analyzed as the circuit of FIG. 6D.

As explained above, using (sharing) scan flip-flops of control points for logically-equivalent signal lines can reduce the area overhead due to insertion of control points without decreasing the testability.

Figure 7:
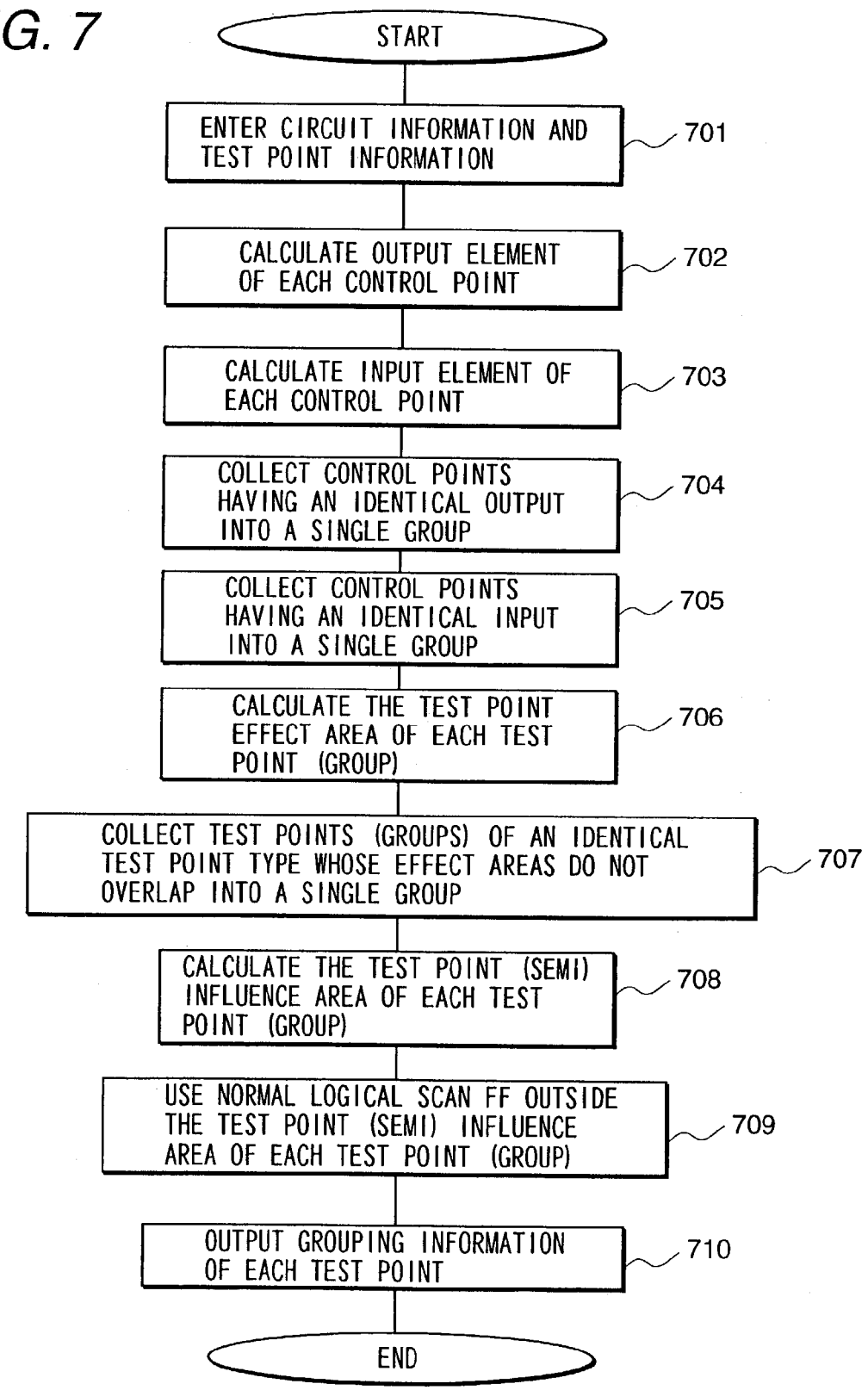
FIG. 7 is an operational flow diagram of a process for designing a semiconductor integrated circuit according to the present invention.

FIG. 7 shows an operational flow of calculating groups which can share a scan flip-flop.

Step 701 enters circuit information and information about test points that are already determined.

Step 702 traces from a signal line at a position where each control point is inserted towards the output and calculates a set of elements which are closest to the position of insertion and have output signal lines of logics equivalent to those of the signal lines at the position of insertion, but not negative logic.

Step 703 traces from a signal line at a position where each control point is inserted towards the input and calculates a set of elements which are closest to the position of insertion and have input signal lines of logics equivalent to those of the signal lines at the position of insertion, but not negative logic. Step 704 selects a group of control points which matches a set of elements calculated in step 702 and collects them into a group. Step 705 selects a group of control points which matches a set of elements calculated in step 703 and collects them into a group.

Steps 706 through 709 involve analysis under conditions of control point effect areas and observation point effect areas. In this specification, these areas are generically termed "test point effect areas." Step 707 determines a test point or a group of test points which are of the same point type (control point or observation point) and whose effect areas are isolated from each other and collects them into a greater group. Step 709 calculates a control point influence area if the test point or the test point group is a control point type or an observation point influence area if the test point or the test point group is an observation point type and selects normal-logic scan flip-flop in the tested circuit 101 outside these areas as a control point controllable element or an observation point observable element. Finally, step 710 outputs information about grouping of test points.

An explanation will be given of the detailed processing and circuit examples of embodiments of the present invention, using one semiconductor integrated circuit example.

As explained above, FIG. 8A is an example of a logical circuit before test points are inserted and FIG. 8B is an example of a logical circuit after test points are inserted. This circuit contains six control points and two observation points and thus the circuit has eight scan flip-flops for test points.

FIG. 10A shows information about the result of processing (steps 701 through 705 in FIG. 7) on test points in FIG. 8B. The columns 1001 through 1006 respectively list test point numbers, scan flip-flop element numbers (used for test points), test point types, output element numbers (calculated at step 702), input element numbers (calculated at step 703), and group IDs in that order. Scan flip-flops of the same group ID can be replaced by a single scan flip-flop to share. In this example, test points 1 through 4 which belong to an identical input element 831 are assigned an identical group ID1. Similarly, test points 5 and 6 which belong to an identical output element 829 are assigned an identical group ID2.

Figure 9A:
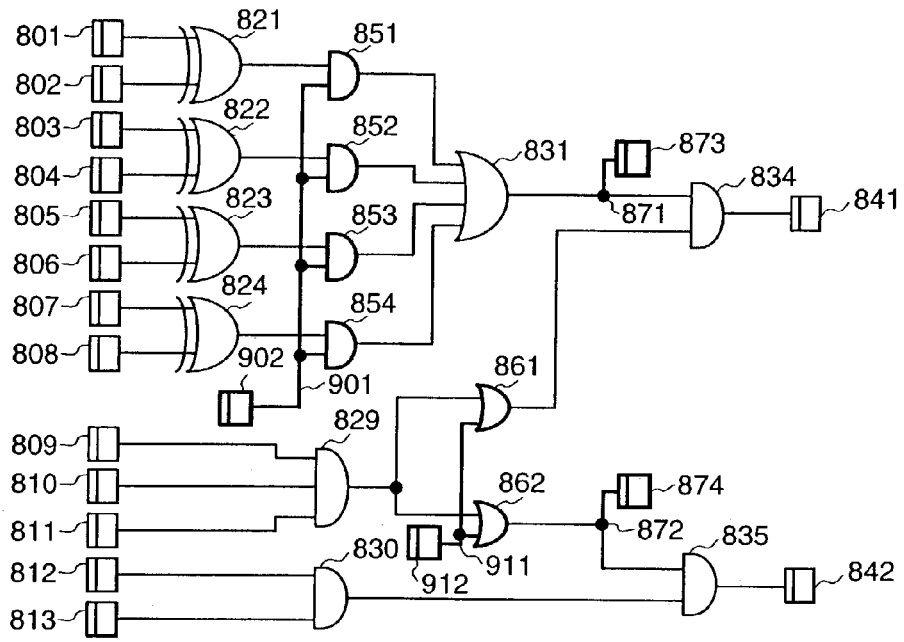
FIGS. 9A and 9B are circuit diagrams of a semiconductor integrated circuit having test points inserted according to one embodiment of the present invention.

FIG. 9A shows a logical circuit whose area overhead due to insertion of test points is reduced according to the information of FIG. 10A. Control points of group ID1 share the signal value of the scan flip-flop 902. The signal value of the scan flip-flop 902 is branched from the signal line 901 to respective control points 851 through 854. Similarly, control points of group ID2 share the signal value of the scan flip-flop 912. The signal value of the scan flip-flop 912 is branched from the signal line 911 to respective control points 861 through 862.

FIG. 10B is a table of information concerning processing (steps 706 through 709) on test points in FIG. 9A.

The columns 1011 through 1016 respectively list test point numbers, scan flip-flop element numbers (used for test points), test point types, element numbers contained in the test point effect areas, element numbers contained in control point influence areas and observation point semi-influence areas, and group IDs in that order. Scan flip-flops of the same group ID can be replaced by a single scan flip-flop to share. Test points 1 and 2 cannot belong to an identical group because their control point effect areas overlap (at elements 834 and 841). Test points 3 and 4 can belong to an identical group because their control point effect areas do not overlap. The column 1017 lists the numbers of normal-logic scan flip-flops which can be used as controllable elements or observable elements. Test point 1 can be selected as a scan flip-flop which can share controlling scan flip-flops 809, 810, and 811 which are not in the control point influence area. No sharable scan flip-flop is available to the test point 2 because the control point influence area of the test point 2 contains all controlling scan flip-flops 801 through 813. Similarly, no sharable scan flip-flop is available to the test points 3 and 4 which belong to an identical group because their observation point semi-influence area contains all controlling scan flip-flops 841 and 842.

Figure 9B:
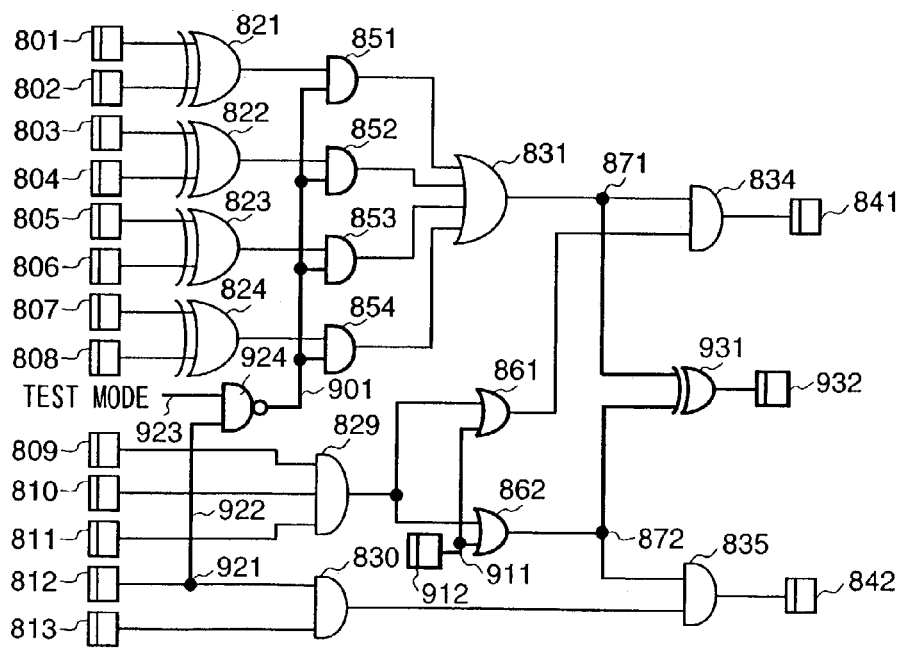

FIG. 9B shows a logical circuit whose area overhead due to insertion of test points is reduced according to the information of FIG. 10B. Control points of group ID1 share the normal-logic scan flip-flop 812. The signal value of the scan flip-flop 812 is branched from the signal line 921 to the signal line 922, and is ANDed with the signal value of the Test Mode signal line 923 by the NAND element 924. The result is transferred from the output line 901 of the NAND element to respective control points 851 through 854. The observation points of said group ID3 are connected to the scan flip-flop 932 through the compressing circuit 931 and their status is observed there.

The resulting circuit has only two scan flip-flops dedicated for test points. This circuit has one fourth as many scan flip-flops for test points of as that FIG. 8B and can drastically reduce the area overhead due to insertion of test points.

As explained above, the semiconductor integrated circuit of the present invention can reduce the area overhead due to insertion of test points without decreasing the effect of testability by using a small number of common scan flip-flops to reduce the number of observation-point scan flip-flops and a small number of other common scan flip-flops to reduce the number of control-point scan flip-flops.

Accordingly, the main object of the present invention is to present a semiconductor integrated circuit whose area overhead due to insertion of test points is reduced by sharing less observation-point and control-point scan flip-flops than required and a method of analyzing the common use of scan flip-flops in the circuit.

Figure 11:
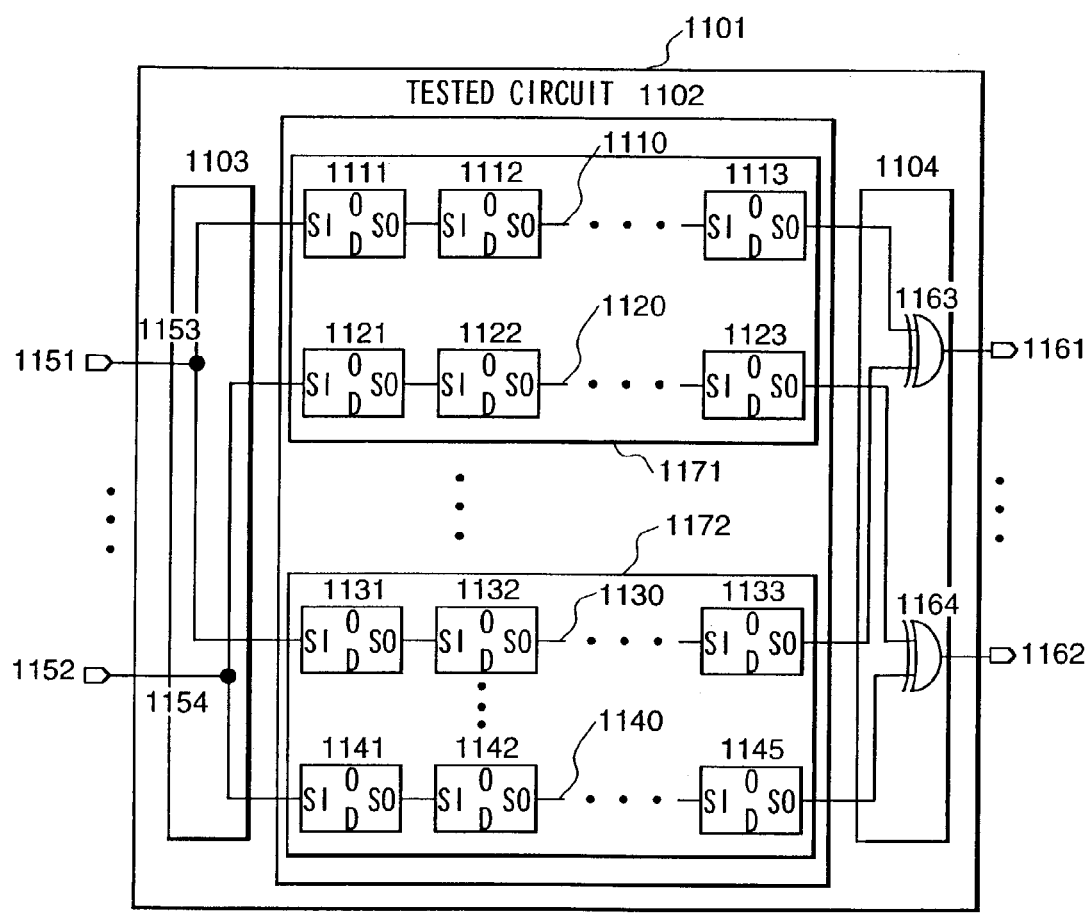
FIG. 11 is a schematic diagram of a semiconductor integrated circuit according to a sixth embodiment of the present invention.

FIG. 11 shows the configuration of a semiconductor integrated circuit according to the sixth embodiment of the present invention. The semiconductor integrated circuit 1101 consists of a tested circuit 1102, scan data input terminals 1151 and 1152, scan data output terminals 1161 and 1162, a line switching circuit 1103, and a code compressing circuit 1104. The tested circuit 1102 has a plurality of scan chains 1110, 1120, 1130, and 1140 to each of which flip-flops with a scan function 1111 through 1113, 1121 through 1123, 1131 through 1133, and 1141 through 1143 are respectively connected so that scan data may be input and output. Further, the tested circuit 1102 has partial circuits 1171 and 1172 which are isolated from each other. The scan chains 1110 and 1120 belong to the partial circuit 1171 and the scan chains 1130 and 1140 belong to the partial circuit 1172. In the line switching circuit 1103, the scan data input line 1151 branches at a point 1153 to the scan chains 1110 and 1130 and the scan data input line 1152 branches at a point 1154 to the scan chains 1120 and 1140. The code compressing circuit 1104 exclusively-ORs the outputs of scan chains 1110 and 1130 by the exclusive OR circuit 1163 and outputs the result to the scan data output terminal 1161. Similarly, the code compressing circuit 1104 exclusively-ORs the outputs of scan chains 1120 and 1140 by the exclusive OR circuit 1164 and outputs the result to the scan data output terminal 1162.

The scan chain 1110 consists of a group of flip-flops with a scan function 1111 through 1113, signal lines connecting their scan-out (SO) pins and scan-in (SI) pins, a signal line connecting between the scan input terminal 1151 and the first scan flip-flop 1111, and a signal line connecting between the last scan flip-flop 1113 and the scan output terminal 1161.

Figure 12:
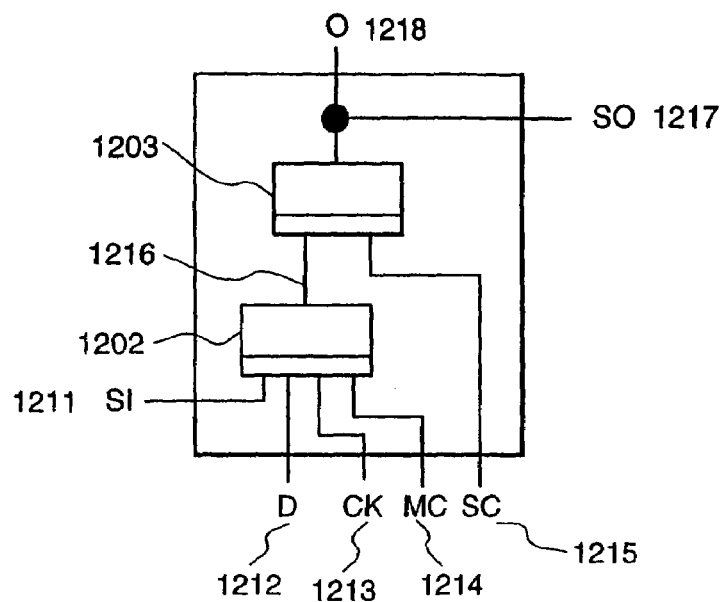
FIG. 12 is a schematic diagram of an example of a flip-flop circuit with a scan function which is used in the sixth embodiment of the present invention.

This scan chain works as a shift register when a clock fed to the scan flip-flop group is controlled (by alternately giving "1", to the master clock and the slave clock with the system clock fixed to "O" as shown FIGS. 15-1 and 2 in case of scan flip-flops of FIG. 12). This is also applicable to scan chains 1120, 1130, and 1140.

An explanation will be given of an example of a flip-flop having a scan function and its operation in reference with FIG. 12.

The flip-flop with a scan function 1201 consists of a master flip-flop 1202 and a slave flip-flop 1203. The master flip-flop 1202 has four inputs: Scan-in (SI) pin 1211, Data-in (D) pin 1212, System Clock (CK) pin 1213, and Master Clock (MC) pin 1214. The master flip-flop 1202 outputs the status to the slave flip-flop 1203 through the signal line 1216. The status value is the value of the D pin when CK=1 and MC=0, the value of the SI pin when CK=0 and MC=1, the previous status when CK=0 and MC=0, or any value when CK=1 and MC=1. The slave flip-flop 1203 inputs a signal 1216 from the master flip-flop 1202 and a slave clock from the slave clock (SC) pin 1215 and outputs the status to the scan-out (SO) pin 1217 and the output (Q) pin 1218. The status value is the value of the signal line 1216 when SC=1 or the previous value when SC=0. Each of the flip-flops with a scan function 1111 through 1113, 1121 through 1123, 1131 through 1133, and 1141 through 1143 in FIG. 11 are functionally the same as the scan function flip-flop 1201, but the clock related pins (CK, MC, and SC) are omitted.

An explanation will be given of the operation of the scan function flip-flop 1201. In normal operation, MC and SC are respectively fixed to "O" and "1", and the flip-flop 1201 works as a flip-flop having a System Clock (CK) pin 1213 and a Data Input (D) pin 1212. In the test operation, to work as one of the shift registers, the scan function flip-flop 1201 takes the value of the scan data input terminal from the Master Clock (MC) input into the master flip-flop 1202 and the status of the master flip-flop 1202 from the Slave Clock (SC) input into the slave flip-flop 1203. The scan function flip-flop 1201 outputs the value to the scan-out (SO) pin 1217 and the output (Q) pin 1218.

When taking a response pattern as a combined circuit, the scan function flip-flop takes the value of the Data Input (D) pin 1212 from the System Clock pin (CK) 1213 into the master flip-flop 1202 and the status of the master flip-flop 1202 from the Slave Clock (SC) input pin 1215 into the slave flip-flop 1203.

An explanation will be given as to how the embodiment of FIG. 11 is tested. First, to set a test pattern, the supplying of a signal to the Scan Data input terminals 1151 and 1152 and the processing of the Master Clock (MC) pin 1214 and the Slave Clock (SC) pin 1215 are repeated as many times as the length of the scan chain. As a result, the signal train supplied to the Scan Data input terminal 1151 is distributed to a plurality of scan chains by the line switching circuit 1103 and is set on the scan function flip-flops 1111 through 1113 in the scan chain 1110 and on the scan function flip-flops 1131 through 1133 in the scan chain 1130. The scan function flip-flops in the same positions in the scan chains 1110 and 1130 (e.g. flop-flops 1111 and 1131) have the same value. Similarly, the signal train supplied to the Scan Data input terminal 1152 is distributed to a plurality of scan chains by the line switching circuit 1103 and is set on the scan function flip-flops 1121 through 1123 in the scan chain 1120 and on the scan function flip-flops 1141 through 1143 in the scan chain 1140. After the test pattern is set on all scan function flip-flops, each scan function flip-flop inputs clocks from the System Clock (CK) pin 1213 and the Slave Clock pin (SC) 1215 and the value of a response pattern calculated in a combined circuit from the Data Input (D) pin 1212. Input processing of the Master Clock (MC) pin 1214 and the Slave Clock (SC) pin 1215 is repeated as many times as the number of scan chains. The values of the scan chains are compressed as a response pattern by the code compressing circuit and output to the Scan Data output terminals 1161 and 1162. As the outputs of the scan chains 1110 and 1130 are exclusively ORed by the exclusive OR gate 1163, an exclusive OR of values taken in by the corresponding scan function flip-flops (e.g. 1111 and 1131)

is output to the Scan Data output terminal 1161. The above processing is repeated as many times as the number of test patterns.

The operation of the semiconductor integrated circuit under test will be explained in detail with reference to FIG. 14A and FIG. 15.

Figure 14A:
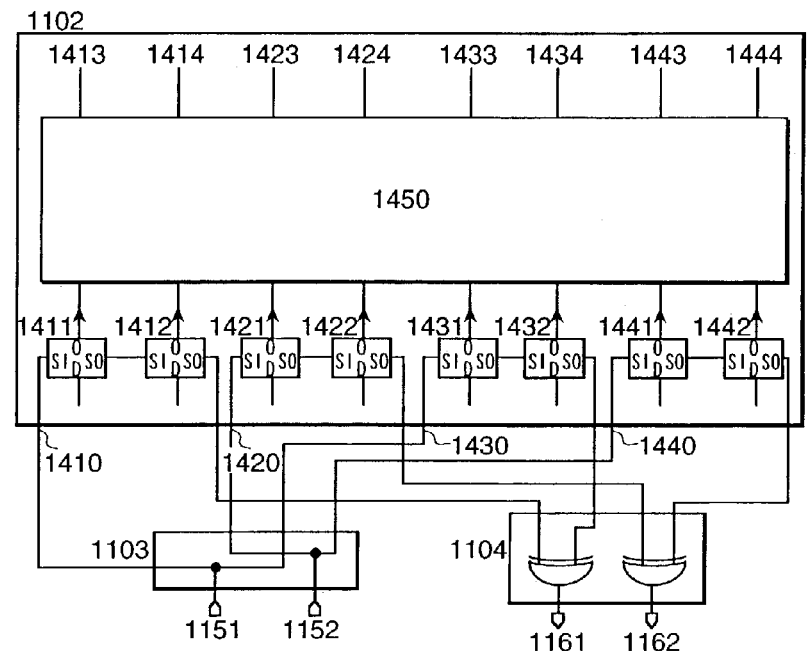
FIGS. 14A–14C are diagrams showing a circuit and signal propagation areas of a scan chain which is used in the sixth embodiment of the present invention.

FIG. 14A is a modification of FIG. 11 to have four scan chains of 2 flip-flops per chain. The figure is partially changed for legibility of the combined circuit 1450. The tested circuit 1102 has four scan chains 1410, 1420, 1430, and 1440. Each scan chain has two scan function flip-flops (1411 and 1412 for the scan chain 1410, 1421 and 1422 for the scan chain 1420, and so on). The block 1450 is a combined circuit part of the tested circuit 1102 and its output signal lines 1413, 1414, 1423, 1424, 1433, 1434, 1443 and 1444 are respectively connected to the Data Input (D) pins 1212 of the scan function flip-flops 1411, 1412, 1421, 1422, 1431, 1432, 1441, and 1442. The line switching circuit 1103 branches the signal line from the Scan Data input terminal 1151 to scan chains 1410 and 1430 and the signal line from the Scan Data input terminal 1152 to scan chains 1420 and 1440. Accordingly, the scan function flip-flops in the same positions in the scan chains 1420 and 1440 (e.g. flop-flops 1411 and 1431, 1412 and 1432, 1421 and 1441, and 1422 and 1442) have the same value.

The code compressing circuit 1104 exclusively ORs the outputs of the scan chains 1410 and 1430 and outputs the result to the Scan Data output terminal 1161. Similarly, the code compressing circuit 1104 exclusively ORs the outputs of the scan chains 1420 and 1440 and outputs the result to the Scan Data output terminal 1161. This example assumes that the partial circuit including the scan chains 1410 and 1420 works independently of the partial circuit including the scan chains 1430 and 1440.

FIG. 15 shows an example of test signal waveforms and timing in the semiconductor integrated circuit of FIG. 14A. This example assumes that two test patterns "a11, a12, b11, b12, X, X, X, X" and "X, X, X, X, a21, a22, b12, b22" are applied to groups of scan function flip-flops (1411, 1412, 1421, 1422, 1431, 1432, 1441 and 1442).

"a11," "a12," "b11," "b12," "a21," "a22," "b21," and "b22" are logical "0" or "1", and "X" represents any value (which can be "0" or "1"). The first pattern is used to detect an assumed fault in the partial circuit containing scan chains 1410 and 1420 and the second pattern is used to detect an assumed fault in the partial circuit containing scan chains 1430 and 1440. In FIG. 15, the first line indicates a time base and the "CK, MC, SC" field shows signal waveforms applied to the System Clock pin 1213, the Master Clock pin 1214, and the Slave Clock pin 1215. The values in the first columns of lines 1151 and 1152 are those applied to the Scan Data input terminals 1151 and 1152. The values in the first columns of lines 1411, 1412, 1421, 1422, 1431, 1432, 1441 and 1442 are those output from the scan function flip-flops (terminals Q and SO in FIG. 12). The values in the first columns of lines 1161 and 1162 are those output from the Scan Data output terminals.

First, at Time 1 to Time 3, the first test pattern is set on the scan function flip-flops. Signal values a12 and a11 are set on the Scan Data input terminal 1151. Signal values b12 and b11 are set on the Scan Data input terminal 1152. Processing on the master Clock (MC) input and the Slave Clock (SC) input is repeated twice. As a result, the signal values "a11" and "a12" shift the scan chains 1410 and 1430. The signal value "a12" is set on the scan function flip-flops 1412 and 1432 and the signal value "a11" is set on the scan function flip-flops 1411 and 1431. The signal values "b11" and "b12" shift the scan chains 1420 and 1440. The signal value "b12" is set on the scan function flip-flops 1422 and 1442 and the signal value "b11" is set on the scan function flip-flops 1421 and 1441. After the test pattern is set on all scan function flip-flops, the system clock (CK) and slave clock (SC) are entered. Signal values ("p11," "p12," "q11," "q12," "r11," "r12," "s11," and "s12") of the response pattern calculated in the combined circuit are taken in from the Data Input (D) pin of each scan function flip-flop. At Time 4 and Time 5, when the first response pattern is taken out, the response pattern is shifted by the Master Clock (MC) input and the Slave Clock (SC) input. The code compressing circuit 1104 exclusively ORs "p12" by "r12," "q12" by "s12," "p11," by "r11," and "q11" by "s11" and outputs the results to the Scan Data output terminals 1161 and 1162.

Similarly, the second test pattern is set at Time 4 to Time 6 (at which the first response pattern is taken out) and the response pattern is taken out at Time 7 and Time 8.

Figure 16:
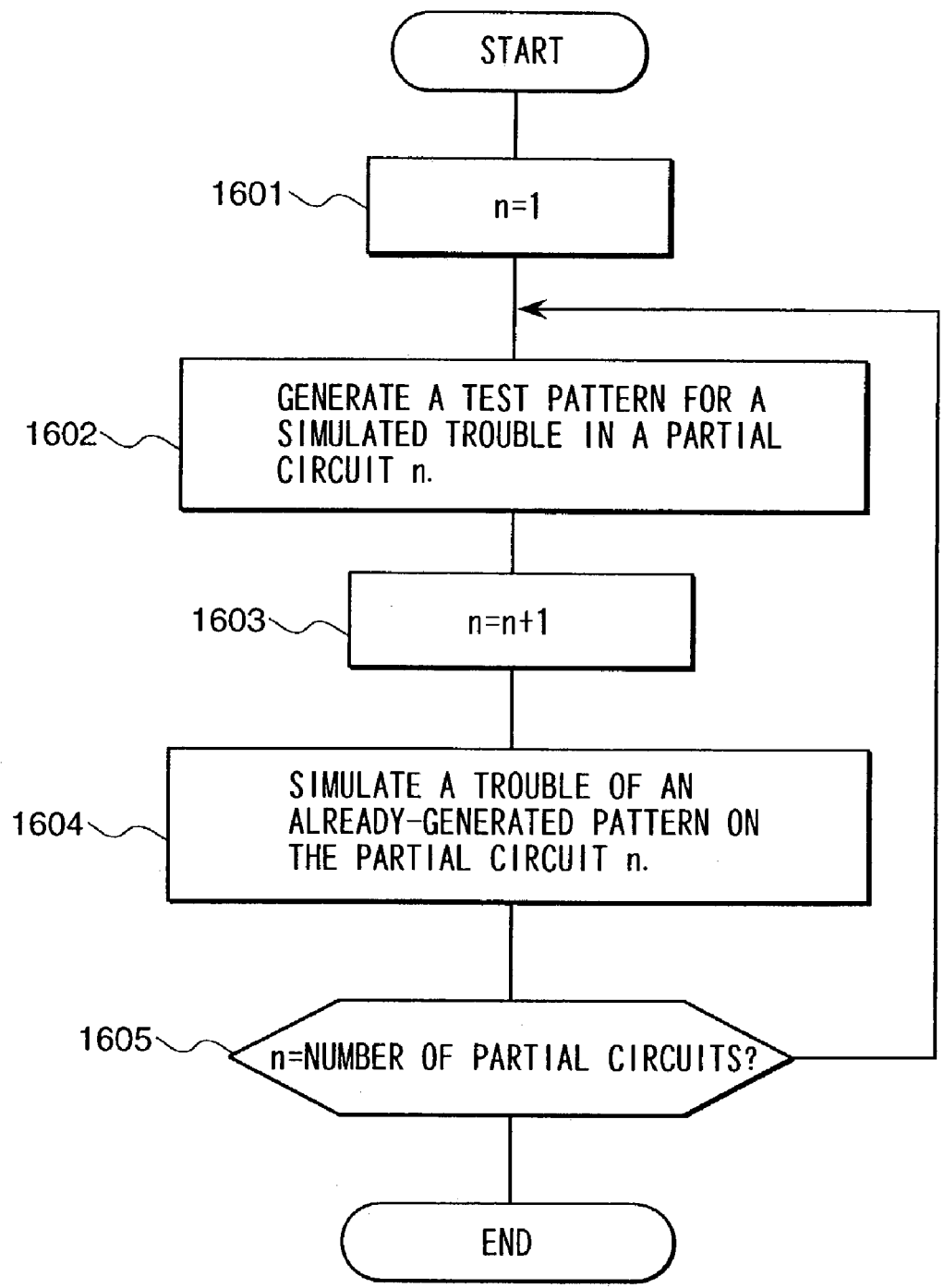
FIG. 16 is a flow diagram which shows an operational flow for generating a test pattern according to the sixth embodiment of the present invention.

Referring to FIG. 16, an explanation will be given of a method of generating a test pattern in the above embodiment.

As shown in FIG. 11, the tested circuit 1102 is divided into independent partial circuits and each partial circuit is given a serial ID number. Step 1601 resets the ID number "n" of a partial circuit to "1." Step 1602 generates a test pattern to detect an assumed fault which has not been detected in the partial circuit "n." Step 1603 increments the ID number "n" of the partial circuit by one. Step 1604 performs a fault simulation with an already-generated pattern on the partial circuit "n." Step 1605 checks the ID number "n" and returns control to the step 1602 to generate a test pattern to detect an assumed fault which has not been detected in the partial circuit "n" if the ID number "n" is not a partial circuit number.

In the case independent combined partial circuits share a scan chain, as shown in FIG. 11 and FIG. 14A, the fault coverage of a single stuck-at fault model in this case does not go lower than that of the case of sharing no scan chain. This is because the ability to set signals and the ability to observe signals remain unchanged. In the former case, a test pattern for a single assumed fault should be singly set on the scan function flip-flops in a partial circuit which has the fault. This is enabled by the Scan Data input terminals 1151 and 1152. In the latter case, the value of a response pattern (e.g. of the scan function flip-flops 1111 and 1131) is compressed. However, as this case assumes that a fault exists only in either of the independent combined partial circuits 1171 and 1172, it never happens that the fault signal propagates into both scan function flip-flops 1111 and 1131 and disappears in the exclusive OR gate 1163.

As this embodiment shares the Scan Data input terminals of scan chains, the total number of values to be entered from the Scan Data input terminals required to set one test pattern on all scan function flip-flops (called the quantity of test data) can be made smaller than the number of all scan function flip-flops. Also, as to the quantity of test data for a set of test patterns necessary to detect a set of special assumed faults, this embodiment can reduce the quantity in comparison with the conventional shift scanning method which does not share scan chains. This is because the high limit of the test data quantity of this embodiment is equal to the quantity of data required to apply a test pattern for fault detection to each independent partial circuit in the conventional shift scanning method. (In this case, the conventional shift scanning method uses shorter test patterns.) This embodiment can reduce the test data quantity further if the test patterns for fault detection in respective partial circuits are identical.

An explanation will be given of the relationship between the number of terminals required for input and output of scan data and a time period required for testing.

When the method of the present invention uses scan chains as long as those of the conventional shift scanning method, the test time period of the method of the present invention is approximately equal to that of the conventional shift scanning method.

However, the number of terminals required for inputs and outputs of scan data can be reduced by sharing the inputs and outputs of scan chains, as provided in this embodiment. When the number of terminals required for input and output of scan data in this embodiment is equal to that in the conventional shift scanning method, scan chains in this embodiment can be made shorter, which leads to reduction in test time. This is because it reduces the number of repetitions of inputs of master and slave clocks per test pattern and consequently reduces the time period required for input and output of scan data.

As already explained above, this embodiment can reduce the quantity of test data without decreasing the fault coverage by causing the scan chains in the independent combined partial circuits to share Scan Data input and output terminals. Further, this embodiment also has the benefit of reducing the number of input and output terminals or reducing the test time period.

This embodiment can reduce the quantity of test data, the number of scan data input and output terminals or the test time period even when the limitation of "Scan chains in independent combined partial circuits" (which is a condition of sharing the scan data input and Output terminals) is removed. However, the fault coverage may be reduced under this condition. This problem (reduction of fault coverage) can be avoided or solved in the following ways.

Figure 13A:
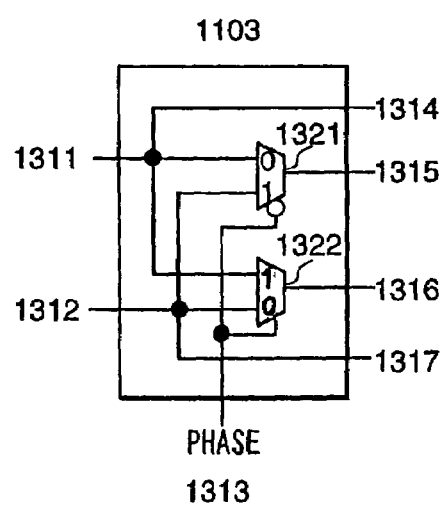
FIG. 13A is a diagram showing an example of a connection changing circuit (1)

For example, one of such ways is to improve the line switching circuit 1103, as shown in FIG. 13A. This line switching circuit changes connection of signal lines 1311 and 1312 (which are connected to Scan Data input terminals) to signal lines 1314 through 1317 according to the value of a phase signal 1313. When the phase signal is "0," the selector 1321 outputs the value of the signal line 1312 to the signal line 1315 and the selector 1322 outputs the value of the signal line 1311 to the signal line 1316. Consequently, the signal line 1311 is connected to signal lines 1314 and 1316. The signal line 1312 is connected to signal lines 1315 and 1317. When the phase signal is "1," the selector 1321 outputs the value of the signal line 1311 to the signal line 1315 and the selector 1322 outputs the value of the signal line 1312 to the signal line 1316. Consequently, the signal line 1311 is connected to signal lines 1314 and 1315. The signal line 1312 is connected to signal lines 1316 and 1317. As a result, this circuit sets a combination of values to be set on all scan function flip-flops which are twice as many as that of the line switching circuit 1103 in FIG. 11. This satisfies the requirement for scan function flip-flops on which only an identical value of a test pattern is set.

Figure 13B:
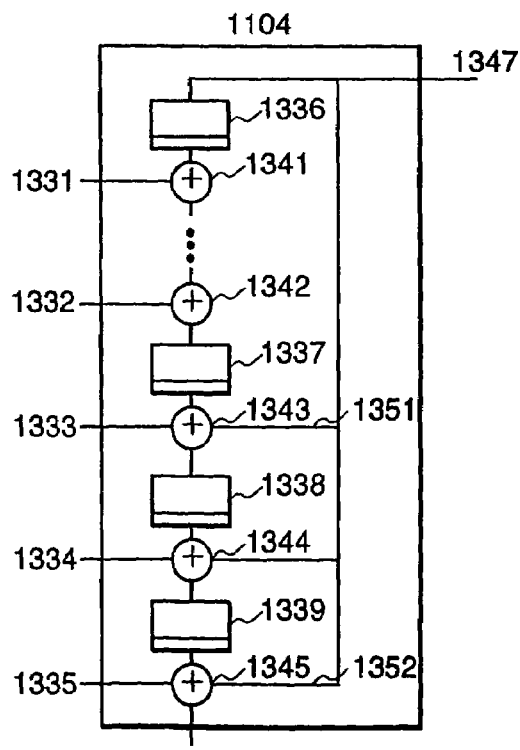
FIG. 13B is a diagram showing an example of a code compressing circuit (2), which are used in the sixth embodiment of the present invention.

Similarly, the problem that a fault signal disappears at a certain relationship of scan chains can be avoided by using shift registers of a linear feedback type, as shown in FIG. 13B. The flip-flops 1336 through 1339 work as shift registers and signal lines 1351 and 1352 are provided to form feedback loops. Signal values from scan chains are fed to exclusive OR gates 1341 through 1346 via signal lines 1331 through 1335 and are compressed by the linear feedback shift registers. The signal line 1347 is provided to reset the linear feedback shift registers and the signal line 1346 is provided to take out a pattern from the linear feedback shift registers. The details of this operation are disclosed in "IEEE Design and Test of Computers" (March, 1993) (Page 79 to Page 81).

An embodiment will be considered, whose fault coverage does not go down even when the condition of sharing Scan Data input output terminals is degraded from "Scan chains in independent combined partial circuits" down to "using combined circuit areas through which signals can propagate."

Figure 14B:
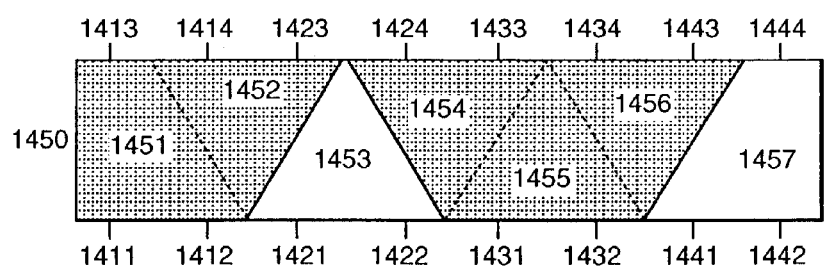
Figure 14C:
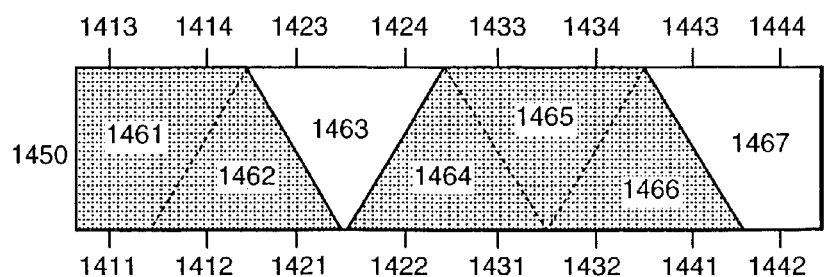

FIGS. 14B and 14C show areas through which signals propagate from scan-function flip-flops in the combined circuit block 1450 of the semiconductor integrated circuit of FIG. 14A. FIG. 14B shows how signals propagate from the "Q" pins of scan-function flip-flops 1411, 1412, 1421, 1422, 1431, 1432, 1441 and 1442 of a single scan chain through areas in the combined circuit block 1450 of the semiconductor integrated circuit of FIG. 14A. Signals from the scan-function flip-flop 1411 and 1412 pass through areas 1451 and 1452 and get to any of the signal lines 1413, 1414, and 1423. Similarly, signals from the scan-function flip-flop 1421 and 1422 pass through areas 1452, 1453, and 1454. Signals from the scan-function flip-flop 1431 and 1432 pass through areas 1454, 1455, and 1456. Signals from the scan-function flip-flop 1441 and 1442 pass through areas 1456 and 1457. As shown from FIG. 14B, the combined circuit areas (hatched areas) through which signals from the scan chain 1410 pass do not overlap with the combined circuit areas (hatched areas) through which signals from the scan chain 1430 pass. Therefore, their abilities to set signals on scan-function flip-flops remain unchanged. This is also applicable to scan chains 1420 and 1440.

FIG. 14C shows how signals propagate to the "D" pins of scan-function flip-flops 1413, 1414, 1423, 1424, 1433, 1434, 1443 and 1444 of a single scan chain through areas in the combined circuit block 1450 of the semiconductor integrated circuit of FIG. 14A.

Signals from the scan-function flip-flops 1411 and 1412 pass through areas 1461 and 1462 and get to any of the signal lines 1413, 1414, and 1423. Similarly, signals from the scan-function flip-flops 1421 and 1422 pass through areas 1462, 1463, and 1464. Signals from the scan-function flip-flops 1431 and 1432 pass through areas 1464, 1465, and 1466. Signals from the scan-function flip-flops 1441 and 1442 pass through areas 1466 and 1467. As shown from FIG. 14C, the combined circuit areas (hatched areas) through which signals from the scan chain 1410 pass do not overlap with the combined circuit areas (hatched areas) through which signals from the scan chain 1430 pass. Therefore, their abilities to observe signals on scan-function flip-flops remain unchanged. This is also applicable to scan chains 1420 and 1440.

As explained above, this embodiment can reduce the quantity of test data without decreasing the fault coverage by causing the scan chains whose signal propagation areas do not overlap with each other to share Scan Data input and output terminals. Further this embodiment also has the advantage of reducing the number of input and output terminals or reducing the test time period.

Figure 17:
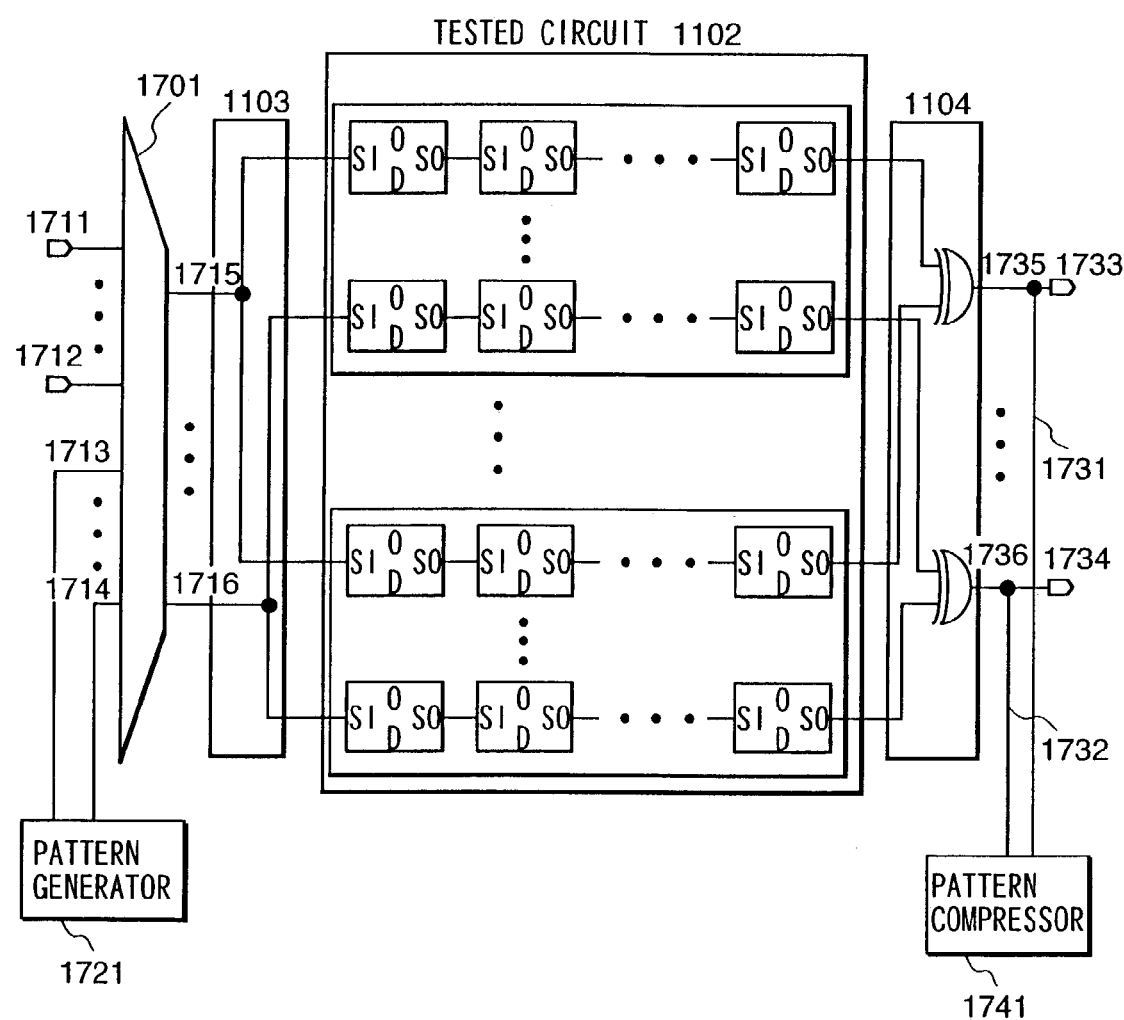
FIG. 17 is a schematic diagram showing an example of the BIST circuit of a semiconductor integrated circuit according to a seventh embodiment of the present invention.

FIG. 17 shows a semiconductor integrated circuit using the BIST (Built-in Self-Test) method sharing signal lines between the pattern generator 1721 and the tested circuit 1102 and sharing signal lines between the tested circuit 1102 and the pattern compressor 1741, according to a seventh embodiment of the present invention.

The tested circuit 1102, the line exchanging circuit 1103, and the code compressing circuit 1104 of this embodiment are the same as those of FIG. 11. A selector 1701 is provided to select the Pattern Set mode or the BIST mode. In the Pattern Set mode, signals applied to the Scan Data input terminals 1711 and 1712 are placed on signal lines 1715 and 1716, and are branched to scan chains by the line exchanging circuit 1103. Signal values output from the tested circuit 1102 are exclusively ORed by the code compressing circuit 1104 and the result is output to the Scan Data output terminals 1733 and 1734. In the BIST mode, signals from the pattern generator 1721 are applied to input terminals 1713 and 1714 and are sent to the line exchanging circuit 1103 through signal lines 1715 and 1716, and then branched to scan chains. The signals output from the tested circuit 1102 are exclusively ORed by the exclusive OR gates 1735 and 1736, compressed by the pattern compressor 1741, and then output. The pattern generator can have some test patterns stored in advance or can generate test patterns at random.

A method of testing a logical circuit to be tested (for detection of a fault) mainly consists of applying a test pattern to the logical circuit and comparing a pattern output from the logical circuit by the applied test pattern.

As explained above, this embodiment of a shift scanning method using the BIST causes scan chains in the independent combined partial circuits to share Scan Data input and output terminals. This leads to sharing of the pattern generator and the pattern compressor and consequently to a reduction in the number of gates and in the number of wires.

Although the aforesaid embodiments mainly handle physical configurations of semiconductor integrated circuits, the present invention is also applicable to software having these functions.

One of the applications of the present invention to software involves storing a circuit information program having the functions of the aforesaid embodiments in storage media, such as a CD-ROM. This enables users (except for the manufacturer of the software) to test semiconductor integrated circuits and their logical circuits easily.

As explained above, the present invention can present a semiconductor integrated circuit which is capable of reducing the area overhead due to insertion of test points, the quantity of test data, and the test time period in the shift scanning method.

What is claimed is:

1. A semiconductor integrate circuit designed by a shift scanning method, which integrated circuit comprises:

at least two test data input terminals;

a plurality of scan chains the number of which is more than the number of said test data input terminals, and a line exchanging circuit that selectively connects the at least two test data input terminals to provide data to selected ones of said scan chains, such that each of the at least two test data input terminals is connected to selected ones of said scan chains in both a first test mode and a second test mode, wherein the combination of scan chains to which each of the at least two test data input terminals is connected in the first test mode is different from the combination of scan chains to which each of the at least two input terminals is connected in the second test mode.

2. A semiconductor integrated circuit as set forth in claim 1, wherein:

each of said scan chains has a plurality of flip-flops that work as shift registers, and said line exchanging circuit interconnects at least two of said scan chains with a single input terminal, wherein all of said scan chains have a function for simultaneously operating as shift registers, and wherein said line exchanging circuit has a function for switching the combination of at least two of said scan chains, and the switching operation is carried out according to the value of a phase signal input to said line exchanging circuit.

3. A semiconductor integrated circuit as set forth in claim 1, wherein:

each of said scan chains has a plurality of flip-flops that work as shift registers, and said line exchanging circuit interconnects at least two of said scan chains with a single input terminal, wherein the number of output terminals for reading out data from said scan chains is less than the number of said scan chains, wherein all of said scan chains have a function for simultaneously operating as shift registers, and wherein said line exchanging circuit has a function for switching the combination of at least two of said scan chains, and the switching operation is carried out according to the value of a phase signal input to said line exchanging circuit.

* * * * *